(12) United States Patent
Iwasaki et al.

(10) Patent No.: US 6,387,476 B1
(45) Date of Patent: May 14, 2002

(54) MAGNETIC FUNCTIONAL ELEMENT AND MAGNETIC RECORDING MEDIUM

(75) Inventors: Yoh Iwasaki; Kazuhiro Bessho, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/393,970

(22) Filed: Sep. 10, 1999

(30) Foreign Application Priority Data

Jul. 14, 1999 (JP) .......................................... 11-200840

(51) Int. Cl.[7] ................................................ G11B 5/66
(52) U.S. Cl. ............. 428/212; 428/694 T; 428/694 TS; 428/694 TR; 428/694 PR; 428/692; 428/900
(58) Field of Search .................... 428/694 PR, 694 TR, 428/694 T, 694 TS, 692, 212, 900

(56) References Cited

U.S. PATENT DOCUMENTS 5,547,774 A * 8/1996 Gimzewski et al. . 428/694 ML
5,549,978 A * 8/1996 Iwasahi et al. ............. 428/692
5,906,884 A * 5/1999 Yahisa et al. ................ 428/212
6,266,036 B1 * 7/2001 Morinero et al. .......... 428/65.3

* cited by examiner

*Primary Examiner*—Leszek Kiliman
(74) *Attorney, Agent, or Firm*—Sonnenschein, Nath & Rosenthal

(57) ABSTRACT

A magnetic functional element can operate stably and reliably with a satisfactorily low rate of power consumption if used to realize an enhanced degree of integration. The magnetic fuctional element comprises strain-sensitive magnetic layer 2 having a magnetic state variable with strain and a strain applying layer 3 adapted to apply strain to the strain-sensitive magnetic layer. The magnetic state of the strain-sensitive magnetic layer 2 is controlled by controlling the strain applied to the strain-sensitive magnetic layer 2. Thus, it is no longer necessary to generate a magnetic field by means of an electric current in order to change the magnetic state of the element.

70 Claims, 12 Drawing Sheets

MAGNETIC FUNCTIONAL ELEMENT AND MAGNETIC RECORDING MEDIUM

RELATED APPLICATION DATA

The present application claims priority to Japanese Application No. P11-200840 filed Jul. 14, 1999 which application is incorporated herein by reference to the extent permitted by law.

BACKGROUND OF THE INVENTION

1. Field of the Invention

This invention relates to a magnetic functional element adapted to make its magnetic state variable and also to a magnetic recording medium comprising a plurality of such magnetic functional elements for recording information.

2. Prior Art

Devices made of a magnetic material are technologically attractive and appealing in two aspects if compared with devices made of a semiconductor and widely used in recent years.

Firstly, an electrically conductive metal material can be used to produce such devices. Therefore, devices made of a magnetic materials show a high carrier density and a low resistance if compared with devices made of a semiconductor material and hence are expected to be good for an enhanced degree of miniaturization and integration.

Secondly, the bistability of magnetic materials in terms of direction of magnetization reveals their high potential of being used for non-volatile memories. In other words, it is expected to realize solid state non-volatile memories that can keep the information they store if the power supply is suspended by utilizing the bistability of magnetic materials.

Solid-state non-volatile memories are expected to fund applications in various technological fields as highly energy-saving memories. More specifically, solid-state non-volatile memories consume little power when left inactive so that they are expected to take a key role in small and portable electronic information processing apparatus because small electronic apparatus comprising such memories require only a small battery capacity and hence will be very lightweight. Additionally, solid-state non-volatile memories fund a strong demand in the rising satellite media business because they can support the operations of satellites when they are shadowed by the earth and their solar light power generation systems have to remain dormant.

In short, devices made of a magnetic material provides the advantages of (1) having a non-volatile memory effect, (2) being free from degradation due to repeated recording/reproducing operations, (3) being adapted to high speed writing operations, (4) being adapted to down-sizing and high density arrangement and (5) being capable of withstanding radiation. These advantages will be discussed below.

(1) Having a Non-volatile Memory Effect

Due to the bistability of magnetic materials in terms of direction of magnetization, the information recorded by utilizing the direction of magnetization is retained without being lost if the drive force fades away as in the case of magnetic recording media including magnetic tapes and magnetic disks.

(2) Being Free from Degradation Due to Repeated Recording/Reproduction Operations For instance, memories made of a ferroelectric material that is bistable (F-RAMs: ferroelectric random access memories) like a magnetic material have been proposed as solid-state non-volatile memories. In the case of F-RAMs, information is rewritten there by inverting the spontaneous dielectric polarization and thereby changing the memory state. However, as the memory state is changed in an F-RAM, ions are moved in the crystal lattice of the device to eventually develop crystal defects there if the rewriting operation is repeated for a number of times exceeding a hundred million. Thus, F-RAMs show a service life the is inevitably limited by the fatigue of the material. To the contrary, in devices realized by utilizing the bistability of a magnetic material, the inversion of magnetization is not accompanied by any migration of ions so that their service life is not limited by the fatigue of the material and information can be rewritten almost limitlessly.

(3) Being Adapted to High Speed Writing Operations

The rate of inversion of magnetization of a magnetic material is very high, although it does not exceed 1 ns. Therefore, devices adapted to high speed writing operations can be realized by exploiting the high switching rate.

(4) Being Adapted to Down-sizing and High Density Arrangement

The magnetic state of a magnetic alloy can be made to vary remarkably by appropriately selecting the composition and the texture thereof to provide an enhanced degree of freedom for designing a device made of such a magnetic material. Additionally, a device can be made of an electrically conductive magnetic alloy. A device made of an electrically conductive magnetic alloy can be made to show an improved current density in the device if compared with a device made of a semiconductor material for the purpose of down-sizing and high density arrangement.

(5) Being Capable of Withstanding Radiation

Known D-RAMs (dynamic random access memories) adapted to change the memory state for rewriting information by charging an electric load give rise to an electric discharge when exposed to ionizing radiation that penetrates the device and change the memory state. To the contrary, the direction of magnetization of a magnetic material is not disturbed if exposed to ionizing radiation. Therefore, devices made of a magnetic material are highly capable of withstanding radiation. Thus, devices made of a magnetic material can effectively be used in applications that require an enhanced ability of withstanding radiation such as communication satellites. As a matter of fact, magnetic bubble memories made of a magnetic material are widely used in satellites.

As described above, devices made of a magnetic material provide various advantages and there have been proposed various solid-state magnetic memories (M-RAMs: magnetic random access memories) that are designed to fully exploit these advantages. Generally, a magnetic thin film having a uniaxial magnetic anisotropy is used as memory carrier in an M-RAM and information is recorded in the memory by inverting the direction of magnetization of the magnetic thin film. In other words, an M-RAM is a magnetic memory device utilizing the arrangement of a magnetic material for storing information. Thus, unlike a magnetic tape or a magnetic disk, it can store information without requiring an operation of moving the memory carrier relative to a magnetic head.

However, known M-RAMs are provided with conductors arranged close to the memory carrier in order to invert the direction of magnetization of the carrier. Then, the operation of inverting the direction of magnetization of the carrier is controlled by applying a current pulse to the conductor and utilizing the magnetic field generated by the current pulse. However, the operation of inverting the direction of magnetization of the carrier by utilizing the magnetic field generated by a current pulse is accompanied by two major problems.

Firstly, cross talks can arise as a result of an operation of inverting the direction of magnetization by means of a magnetic field. Since a magnetic field can exert force over a long distance, it can innegligibly affect regions neighboring the memory carrier for inverting the direction of magnetization to consequently give rise to cross talks. If such memory carriers are arranged highly densely in a device, it will no longer be possible to stably carry out the operation of inverting the direction of magnetization and the reliability of the device. While there have been proposed memory carriers provided with a structure for shielding the carriers from magnetic fields [see, inter alia, Z. G. Wang, et al., IEEE Trans Magn., Mag 33, 4498 (1997)], such an arrangement makes the device structurally complex.

Secondly, because a magnetic field generated by applying a current pulse to conductors, the coercive force of the memory carrier can be reduced as fine conductors are used for the purpose of miniaturization. This problem will be discussed hereinafter.

The current density i [A/m$^2$] of a conductor has a limit that is defined by the material of the conductor. As the device is miniaturized and the diameter of the conductor is reduced, the upper limit of the electric current available to the device will be lowered.

If the diameter of the conductor is D [m], the intensity of magnetic field H [A/m] at a spot separated from the center of the conductor by a distance of L [m] will be expressed by formula 1 below.

$$H = (\pi i D^2/4)/(2\pi L) \qquad 1$$

The distance L between the conductor and the memory carrier cannot be significantly greater than D, a relationship of L=D can be assumed. Then, the intensity of magnetic field H applied to the memory carrier can be expressed by formula 2 below.

$$H = (\pi i D^2/4)/(2\pi L) = iD/8 \qquad 2$$

If the permissible current density of the conductor is i=10$^{11}$ [A/m$^2$] and if D' [$\mu$m]=D [m]×10$^6$ is assumed, then the intensity of magnetic field applied to the memory carrier can be expressed by formula 3 below.

$$H = 12,500 \times D'[A/m] = 156 \times D'[Oe] \qquad 3$$

Thus, the intensity of magnetic field that can be used for inverting the direction of magnetization of the memory carrier is reduced approximately in proportion to the size reduction of the device, taking the effect into consideration that the memory carrier made of a magnetic material can be placed closer to the conductors and hence to the magnetic field generating source as the diameter of the conductor is reduced.

Meanwhile, the coercive force of the memory carrier has to be so designed that the direction of magnetization is reliably inverted by an externally applied magnetic field. Thus, the coercive force of the memory carrier has to be reduced as the intensity of magnetic field that can be applied to the memory carrier is reduced as a function of miniaturization of the device. In other words, in a device adapted to invert the direction of magnetization by means of a magnetic field generated by an electric current, the coercive force of the memory carrier has to be reduced as a function of miniaturization of the device.

However, when the coercive force is reduced too much, the device will no longer be able to reliably store the recorded information and become apt to be adversely affected by an external magnetic field. Then, as the diameter of the conductors is reduced in order to realize a higher degree of integration for memory carriers, the reliability of the device will inevitably be lowered. This will give rise to a serious problem particularly when such a device is used as a memory in small portable electronic information equipment that is more often than not used in an environment where it is exposed to external magnetic fields.

As discussed above, a device made of a magnetic material is accompanied by a problem that an enhanced degree of integration and the reliability of the device are not compatible if an operation of inverting the direction of magnetization is carried out by utilizing the magnetic field generated by applying a current pulse to a conductor. Additionally, since the operation of inverting the direction of magnetization by utilizing the magnetic field generated by applying a current pulse to a conductor requires the used of a large electric current to obtain a magnetic field necessary for inverting the direction of magnetization, there arises a problem of sacrificing the energy saving characteristics of a device made of a magnetic material for the relatively large consumption of electric current.

While devices made of a magnetic material have been described in terms of M-RAMs adapted to store information along the direction of magnetization, it will be appreciated that spin transistors, for instance, whose output changes as a function of the direction of magnetization of the magnetic material from which they are made are not free from the above problems either.

On the other hand, most of the technological developments relating to devices made of magnetic materials in recent years are those for raising the level of the signals read out from the memory carrier in order to make the device operate consistently with the peripheral circuits. Additionally, the method of using a magnetic field generated by a current pulse flowing through the conductor for inverting the direction of magnetization for the memory carrier as described above and accompanied by a number of problems has been followed to date without significant improvements.

In view of the above identified circumstances, it is therefore the object of the present invention to dissolve the above identified problems and provide a magnetic functional element and a magnetic recording medium that can operate stably and reliably with a satisfactorily low rate of power consumption if used to realize an enhanced degree of integration.

SUMMARY OF THE INVENTION

The inventors of the present invention particularly paid attention to that the above identified problems are attributable to the fact that the magnetic field to be used for inverting the direction of magnetization is generated by means of an electric current. As a result of intensive research efforts, the inventors of the present invention came to find that it is possible to realize a magnetic functional element and a magnetic recording medium that operate excellently without damaging the advantages of a device made of a magnetic material by changing the magnetic state of a magnetic material without applying a magnetic field.

Thus, according to an aspect of the invention, there is provided a magnetic functional element comprising a strain-sensitive magnetic layer having a magnetic state variable with strain and a strain applying layer adapted to apply strain to the strain-sensitive magnetic layer.

With a magnetic functional element according to the invention and having a configuration as described above, the strain-sensitive magnetic layer changes its magnetic state as strain is applied thereto by the strain applying layer. Thus, no magnetic field has to be applied to the element to change its magnetic state and, therefore, it is free from the above identified problems that are attributable to the electric current used to generate a magnetic field. As a result, a magnetic functional element according to the invention operates stably and reliably with a satisfactorily low rate of power consumption if used to realize an enhanced degree of integration.

According to another aspect of the invention, there is provided a magnetic recording medium comprising a plurality of magnetic functional elements, each including a strain-sensitive magnetic layer having a magnetic state variable with strain and a strain applying layer adapted to apply strain to the strain-sensitive magnetic layer, and adapted to record information by using changes in the strain-sensitive magnetic layer of each element.

With a magnetic recording medium according to the invention and having a configuration as described above, the strain-sensitive magnetic layer of each magnetic functional element changes its magnetic state as strain is applied thereto by the strain applying layer thereof so that information may be stored in the recording medium by the change. Thus, no magnetic field has to be applied to the element to change the magnetic state of the magnetic material of the element and, therefore, the latter is free from the above identified problems that are attributable to the electric current used to generate a magnetic field. As a result, a magnetic recording medium according to the invention operates stably and reliably with a satisfactorily low rate of power consumption if the magnetic functional elements are arranged to realize an enhanced degree of integration.

As described above, in a magnetic functional element according to the invention, the strain-sensitive magnetic layer changes its magnetic state as strain is applied thereto by the strain applying layer. Thus, no magnetic field has to be applied to the element to change its magnetic state and, therefore, it is free from the problems that are attributable to the electric current used to generate a magnetic field. As a result, a magnetic functional element according to the invention operates stably and reliably with a satisfactorily low rate of power consumption if used to realize an enhanced degree of integration. Thus, according to the invention, an excellent magnetic functional element can be realized to fully exploit the advantages of a magnetic material.

Additionally, in a magnetic recording medium according to the invention, the strain-sensitive magnetic layer of each magnetic functional element changes its magnetic state as strain is applied thereto by the strain applying layer thereof so that information may be stored in the recording medium by the change. Thus, no magnetic field has to be applied to the element to change the magnetic state of the magnetic material of the element and, therefore, the latter is free from the above identified problems that are attributable to the electric current used to generate a magnetic field. As a result, a magnetic recording medium according to the invention operates stably and reliably with a satisfactorily low rate of power consumption if the magnetic functional elements are arranged to realize an enhanced degree of integration. Thus, according to the invention, an excellent magnetic recording medium can be realized to fully exploit the advantages of a magnetic functional element made of a magnetic material.

BRIEF DESCRIPTION OF THE DRAWINGS

FIGS. 2A and 2B are schematic views of another embodiment of magnetic functional element according to the invention, also showing its basic configuration, of which FIG. 2A shows a state where no voltage is applied to the piezoelectric layer thereof and FIG. 2B shows a state where a voltage is being applied to the piezoelectric layer.

FIGS. 4A through 4C are graphs showing magnetization curves illustrating history of magnetization along the direction of strain application when strain $\in$ is applied to the magnetic material, of which FIG. 4A is a graph obtained when $\in<10^{-5}$ and FIG. 4B is a graph obtained when $\in=2\times10^{-4}$, while FIG. 4C is a graph obtained when $\in=3\times10^{-4}$.

FIGS. 5A through 5C are graphs showing magnetization curves illustrating history of magnetization along a direction perpendicular relative to the direction of strain application when strain $\in$ is applied to the magnetic material, of which FIG. 5A is a graph obtained when $\in<10^{-5}$ and FIG. 5B is a graph obtained when $\in=1\times10^{-4}$, while FIG. 5C is a graph obtained when $\in=2\times10^{-4}$ and FIG. 5D is a graph obtained when $\in=3\times10^{-4}$.

FIGS. 9A and 9B are schematic plan views of the embodiment of FIG. 7, illustrating the operation thereof, of which FIG. 9A is a view where the direction of strain application is running in parallel with the easy axis of magnetization and FIG. 9B is a view where the direction of strain application is running obliquely relative to the easy axis of magnetization.

FIGS. 14A through 14D are schematic lateral views of still another embodiment of magnetic functional element according to the invention, of which FIG. 14A shows an initial state and FIG. 14B shows a state when compressive strain is applied thereto, while FIG. 14C shows a state when the compressive strain is removed therefrom and FIG. 14D shows a state when tensile strain is applied thereto.

DETAILED DESCRIPTION OF THE INVENTION

No, the present invention will be described in greater detail by referring to the accompanying drawings that illustrate preferred embodiments of magnetic functional element and those of magnetic recording medium according to the invention. Firstly, an embodiment of magnetic functional element 1 according to the invention and having a basic configuration as shown in FIG. 1 will be discussed.

Figure 1:
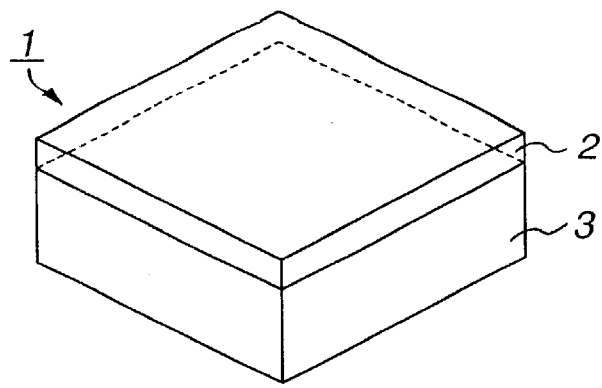
FIG. 1 is a schematic perspective view of an embodiment of magnetic functional element according to the invention, showing its basic configuration.

Referring to FIG. 1, the magnetic functional element 1 comprises a strain-sensitive magnetic layer 2 whose magnetic state is changed by strain and a strain applying layer 3 adapted to apply strain to the strain-sensitive magnetic layer 2. While the strain-sensitive magnetic layer 2 and the strain applying layer 3 are laid one on the other to form a multilayer structure in FIG. 1, the arrangement of the layers in a magnetic functional element 1 according to the invention is not limited to a multilayer structure and the strain applying layer 3 may alternatively be arranged close to the strain-sensitive magnetic layer 2 to such an extent that the former may apply strain to the latter.

In he magnetic functional element 1, the strain-sensitive magnetic layer 2 changes its magnetic state as strain is applied by the strain applying layer 3. Thus, it is no longer necessary to externally apply a magnetic field to the magnetic functional element 1 in order to change the magnetic state of the strain-sensitive magnetic layer 2 so that the magnetic functional element is free from the problems of known M-RAMs including the problem of generation of cross talks and that of reduced coercive force occurring as result of miniaturization of the device that arise when the direction of magnetization is inverted by externally applying a magnetic field thereto. Therefore, the magnetic functional element 1 operates stably and reliably if used to realize an enhanced degree of integration.

The piezoelectric effect or the electrostrictive effect may be utilized to generate strain in the magnetic functional element 1. More specifically, a strain generating section made of a piezoelectric material may be arranged adjacent to the strain applying layer 3. Then, strain may be applied to the strain-sensitive magnetic layer 2 by the strain generating section that utilizes the piezoelectric effect or the electrostrictive effect by way of the strain applying layer 3. Thus, the magnetic functional element 1 is a voltage driven type element whose magnetic state can be controlled by applying a voltage thereto.

Therefore, if compared with a current driven type element whose magnetic state is controlled by means of an electric current as described above by referring to the conventional method of inverting the direction of magnetization, the magnetic functional element 1 can be driven to operate with a significantly reduced power consumption rate and save energy. Additionally, if compared with a current driven type element, the magnetic functional element 1 can operate stable and reliable without using any cooling system if used to realize an enhanced degree of integration or driven at high speed.

Additionally, in the case of a current driven type element, the direction along which a magnetic field is applied thereto has to be changed in order to reversibly change the magnetic state of the magnetic material of the element. This is realized by reversing the direction along which the electric current flows through the conductor or by applying a magnetic field from separate respective conductors arranged for the opposite directions. On the other hand, the magnetic state of the strain-sensitive magnetic layer 2 of the magnetic functional element 1, which is a voltage driven type element, can be changed in two opposite directions simply by changing the positiveness of the applied voltage to the negativeness or vice versa. Therefore, the magnetic functional element 1 may have a simplified configuration if compared with a current driven type element.

In the magnetic functional element 1, the strain applying layer 3 may be made to function also as strain generating section if it is made of a material having a piezoelectric effect or a electrostrictive effect. Now, an embodiment of magnetic functional element 10 having such a configuration will be described by referring to FIGS. 2A and 2B.

Figure 2A:
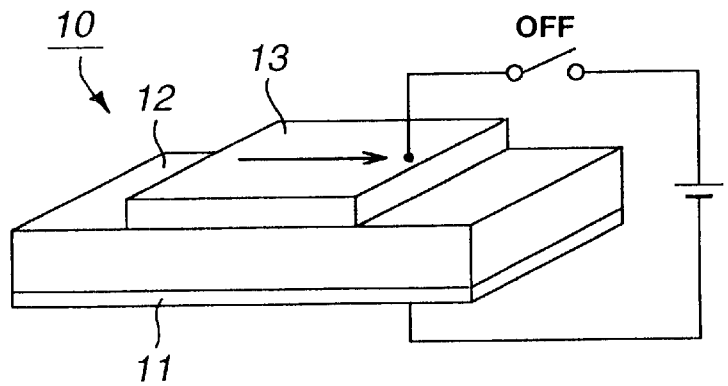
Figure 2B:
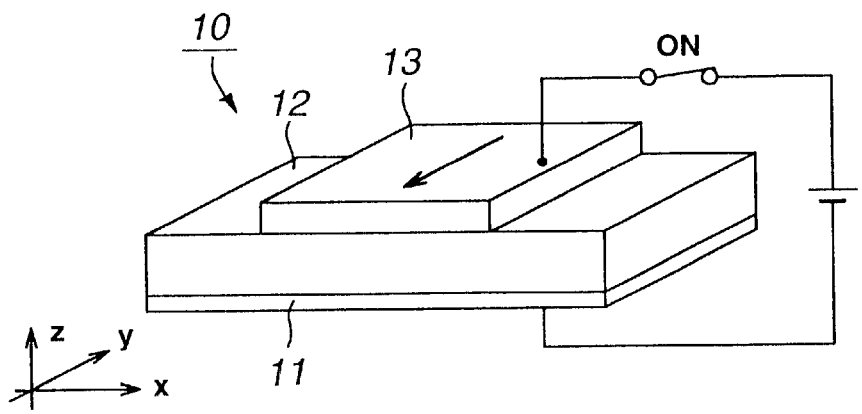

As shown in FIGS. 2A and 2B, the magnetic functional element 10 comprises an electrically conductive electrode layer 11, a piezoelectric layer 12 adapted to generate strain when a voltage is applied thereto and a strain-sensitive magnetic layer 13 laid one on the other to produce a multilayer structure. The strain-sensitive magnetic layer 13 is made of an electriccally conductive material whose magnetic state is changed by strain and operates as electrode for the piz layer 12. In other words, the magnetic functional element 10 has a configuration where a piezoelectric layer 12 is arranged between a pair of electrodes, which are an electrode layer 11 and a strain-sensitive magnetic layer 13. Additionally, the piezoelectric layer 12 operates as strain applying layer for the strain-sensitive magnetic layer 13.

As shown in FIGS. 2A and 2B, if no voltage is applied to the pair of electrodes and hence no strain is applied to the strain-sensitive magnetic layer 13 in the magnetic functional element 10, the direction of magnetization of the strain-sensitive magnetic layer 13 is normally made to be same as the +x-direction. If, then, a voltage is applied to the piezoelectric layer 12 and strain is applied to the strain-sensitive magnetic layer 13, the direction of magnetization of the strain-sensitive magnetic layer 13 is made to be same as the −y-direction.

While the polarity of the voltage applied to the piezoelectric layer 12 is fixed in FIGS. 2A and 2B, it may alternatively be so arranged that the polarity of the voltage applied to the piezoelectric layer 12 can be switched from positive to negative or vice versa. With such an arrangement, it is possible to selectively apply two types of strain to the strain-sensitive magnetic layer 13, tensile strain and compressive strain, to broaden the scope of controllability of the direction of magnetization.

As described above, the magnetic functional element 10 can be made to have a simplified configuration since the piezoelectric layer 12 operates both as strain generating section and as strain applying layer. While the direction of magnetization of the strain-sensitive magnetic layer 13 can be switched in the above description, it may not necessarily be so, the only requirement to be met here being that the strain-sensitive magnetic layer 13 should change its magnetic state when strain is applied thereto.

While the piezoelectric effect or the electrostrictive effect is utilized to apply strain to the strain-sensitive magnetic layer 2 of the magnetic functional element 1 and also to the strain-sensitive magnetic layer 13 of the magnetic functional element 10 in the above description, a magnetic functional element according to the invention does not necessarily rely on the piezoelectric effect or the electrostrictive effect to applying strain to the strain-sensitive magnetic layer. For instance, strain may be generated in the strain applying layer 3 of the magnetic functional element 1 by irradiating the strain applying layer 3 with a ultrasonic pulse and then applied to the strain-sensitive magnetic layer 2.

For producing a magnetic functional element according to the invention, it is important to select an appropriate material for the strain-sensitive magnetic layer 2 or the strain-sensitive magnetic layer 13. In other words, a magnetic functional element showing an excellent relationship between the magnetic state and the strain applied thereto can be realized by using a material that changes its magnetic state remarkably in response to the strain applied thereto for the strain-sensitive magnetic layer. Therefore, magnetic materials that can be used for the strain-sensitive magnetic layer will be discussed below.

Figure 3:
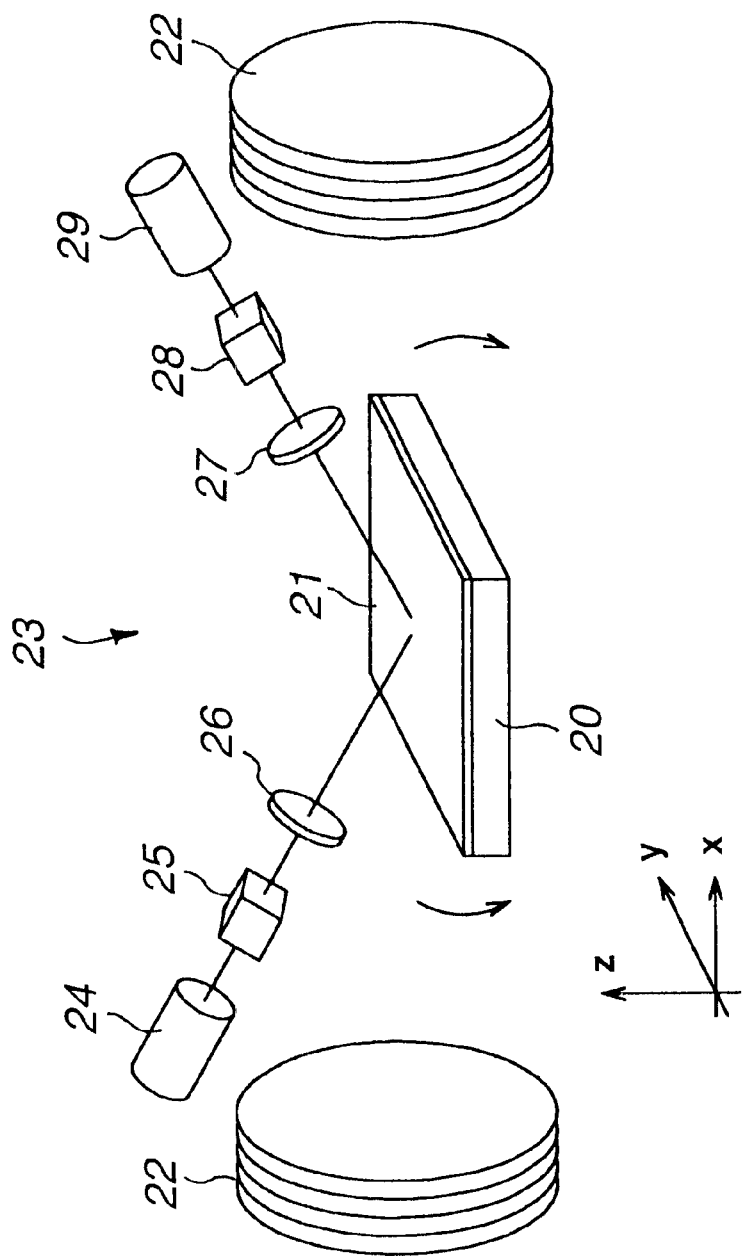
FIG. 3 is a schematic illustration of a gauge for measuring the components of magnetization of a magnetic material.

The strain dependency of the magnetic state of a magnetic material can be examined by means of a gauge having a configuration as illustrated in FIG. 3. The gauge is designed to measure the history of magnetization along the x-direction of a magnetic thin film layer 21 formed on the surface the substrate 20 of a specimen by applying strain to the layer 21 while applying a magnetic field to it by means of a coil 22 to utilize the magneto-optical Kerr effect.

The gauge comprising a stage (not shown) for rigidly holding the substrate 20 of the specimen. The stage is provided with a mechanism for applying a bending moment to the specimen substrate 20 in order to bend it in the ±x-direction or the ±y-direction. Therefore, as the specimen substrate 20 is bent, the magnetic layer 21 on the specimen substrate 20 is expanded or compressed in the intra-planar direction of the thin film and consequently subjected to strain.

The gauge additionally comprises a pair of coils 22 to sandwich the specimen substrate 20 from opposite sides so that a magnetic field may be applied to the magnetic layer 21 on the specimen substrate 20. The paired coils 22 are rotatable around the z-direction with the center of rotation located on the specimen substrate 20. The gauge also comprises a gauging system 23 for observing the history of magnetization of the magnetic layer 21 that includes a laser oscillator 24, a polarizer 25, a first lens 26, a second lens 27, an analyser 28 and a photo detector 29.

For gauging the strain dependency of the history of magnetization of the magnetic layer 21, firstly strain is applied to a predetermined extent to the specimen substrate 20 carrying a magnetic thin film layer 21 thereon by means of the stage. Then, while keeping the strain being applied to the specimen substrate 20, the laser beam emitted from the laser oscillator 24 is irradiated onto the surface of the magnetic layer 21 by way of the polarizer 25 and the first lens 26. Then, the laser beam reflected by the magnetic layer 21 is detected by the photo detector 29 by way of the second lens 27 and the photo detector 28 to observe the strain dependency of the history of magnetization of the magnetic layer 21.

Now, an experiment conducted to observe the strain dependency of the history of magnetization of an Fe—Rh alloy by means of a gauge having a configuration as described above will be discussed below. A glass substrate was used for the specimen substrate 20, on which a thin film of an ferromagnetic Fe—Rh alloy was formed by deposition, using a sputtering technique.

Figure 4A:
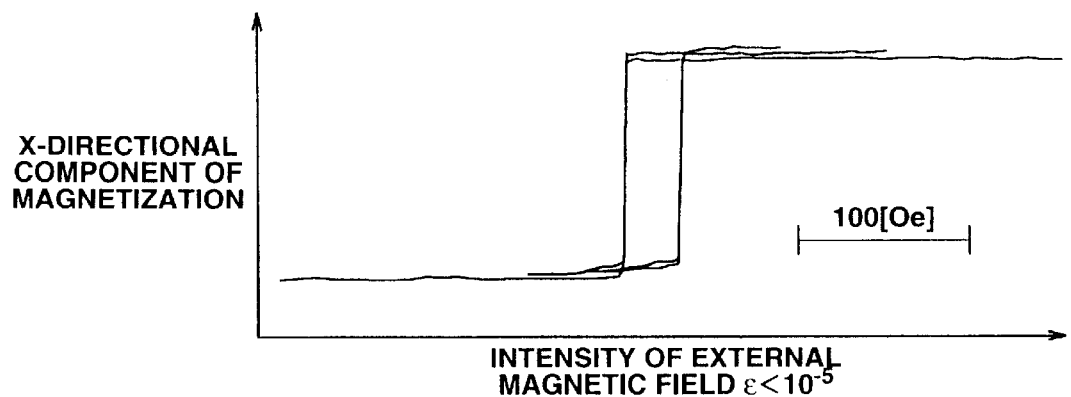
Figure 4B:
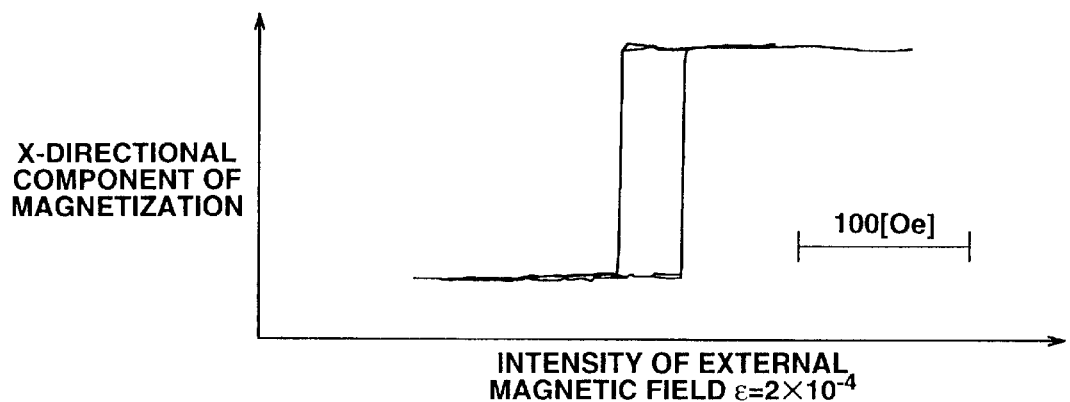
Figure 4C:
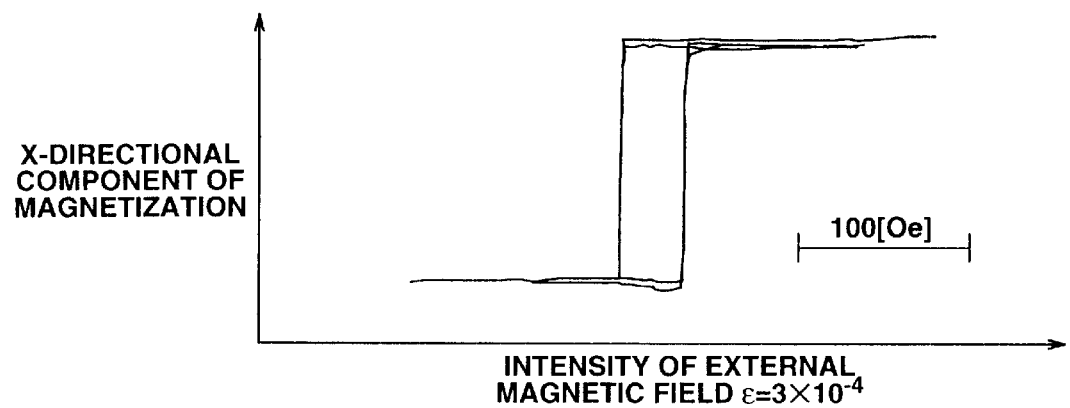

Firstly, tensile strain was intra-planarly applied to the magnetic layer 21 that was a thin film of the Fe—Rh alloy along the x-direction to observe the history of magnetization in the x-direction. FIGS. 4A through 4C show the obtained results. More specifically, FIGS. 4A through 4C show magnetization curves obtained respectively by using different values of $\in<1\times10^{-5}$, $\in=2\times10^{-4}$ and $\in=3\times10^{-4}$ for the tensile strain $\in$. In each of FIGS. 4A through 4C, the horizontal axis represents the intensity of the external magnetic field applied to the magnetic layer 21 and the vertical axis represents the x-directional component of the magnetization produced in the magnetic layer 21.

As clearly seen from FIGS. 4A through 4C, the direction of magnetization that is parallel to the direction of the strain applied to the magnetic layer 21 is inverted from a negatively saturated value to a positively saturated value when the external magnetic field shows a certain given value and the saturated value is maintained when the intensity of the external magnetic field is equal to 0. Additionally, the magnetization curve shows a substantially rectangular loop within a swinging cycle of the external magnetic field extending from the positive side to the negative side in each of the graphs. Thus, it will be seen that an easy axis of magnetization is produced in the magnetic layer 21 along the direction of the tensile force.

Table 1 below shows the values of the coercive force Hc of the magnetic layer 21, or the values of the intensity of the external magnetic field when inversion of the direction of magnetization of the magnetic layer 21 occurred.

TABLE 1

| tensile strain ∈ | coercive force Hc (Oe) |
| --- | --- |
| less than $1\times10^{-5}$ | 15.1 |
| $2\times10^{-4}$ | 17.4 |
| $3\times10^{-4}$ | 17.9 |

Table 1 above shows that the greater the tensile strain applied to the magnetic layer 21, the greater the width of the substantially rectangular loop to increase the coercive force of saturated magnetization relative to the intensity of the external magnetic field that is increasing in the opposite direction.

Figure 5A:
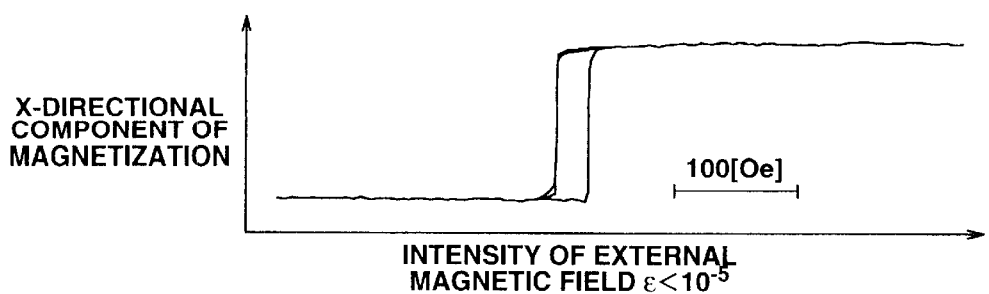
Figure 5B:
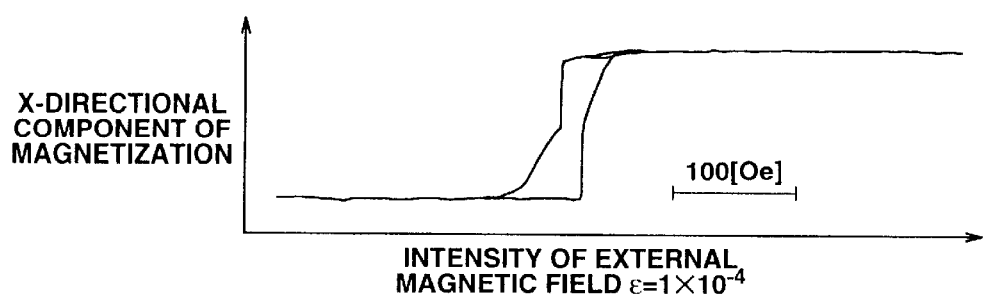
Figure 5C:
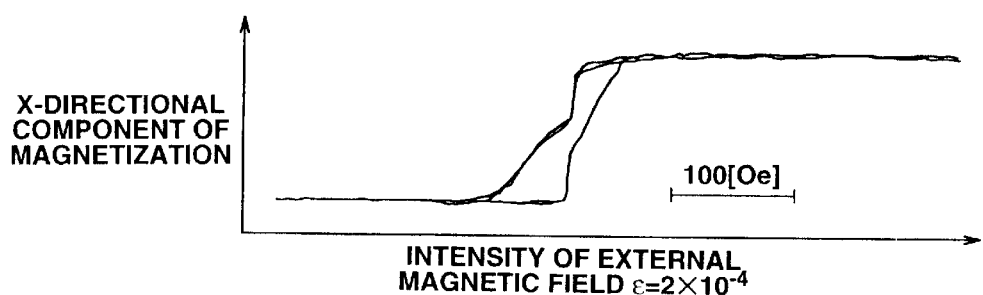
Figure 5D:
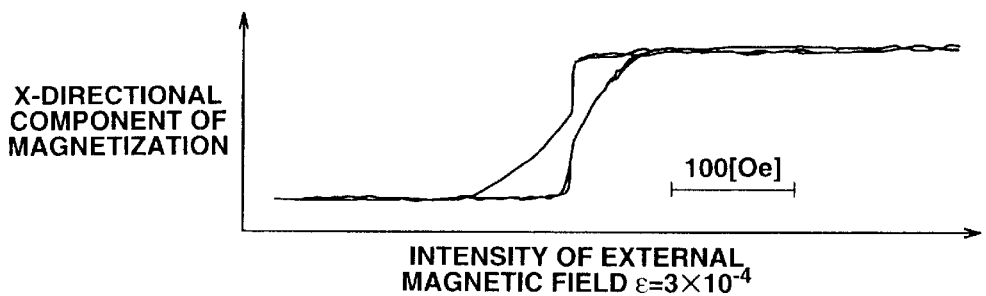

Then, tensile strain was intra-planarly applied to the magnetic layer 21 that was a thin film of the Fe—Rh alloy along the y-direction to observe the history of magnetization in the x-direction that is perpendicular relative to the direction of strain application. FIGS. 5A through 5D show the obtained results. More specifically, FIGS. 5 through 5D show magnetization curves obtained respectively by using different values of $\in<1\times10^{-5}$, $\in=1\times10^{-4}$, $\in=2\times10^{-4}$ and $\in=3\times10^{-4}$ for the tensile strain $\in$. In each of FIGS. 5A through 5D, the horizontal axis represents the intensity of the external magnetic field applied to the magnetic layer 21 and the vertical axis represents the x-directional component of the magnetization produced in the magnetic layer 21.

As clearly seen from FIGS. 5A through 5D, the loop becomes inclined to a greater extent as the applied tensile strain increases. The finding agrees very well with the fact that the external magnetic field is applied in a direction perpendicular to the easy axis of magnetization produced along the direction of tensile strain applied to the magnetic layer 21 and hence in a hard direction of magnetization. In other words, an external magnetic field with a greater intensity is required in order to saturate the magnetization in a direction perpendicular to the direction along which the tensile strain is applied. Additionally, it will be seen that the magnetization level of the magnetic layer 21 remarkably falls below the saturation level when the intensity of the external magnetic field is made equal to 0.

The intensity of the external magnetic field when the magnetization of the magnetic layer 21 gets to the saturation level and hence the loop of the magnetization curve is closed in any of FIGS. 5A through 5D reflects the magnitude of anisotropy. Therefore, the intensity of the external magnetic field at this time will be referred to as anisotropic magnetic field $H_k$ (Oe) and used as yardstick for determining the magnitude of the magnetic anisotropy of the magnetic layer 21 hereinafter. Table 2 below shows the results obtained by observing the anisotropic magnetic field $H_k$ for the cases of FIGS. 5A through 5D. Note that the saturation of magnetization shows a too sharp slope to observe the anisotropic magnetic field $H_k$ when the tensile strain of the magnetic layer 21 is less than $1 \times 10^{-5}$ and hence the value of the anisotropic magnetic field is not shown in Table 2.

TABLE 2

| tensile strain ϵ | negative anisotropic magnetic field $H_k$ − (Oe) | positive anisotropic magnetic field $H_k$ + (Oe) |
|---|---|---|
| less than $1 \times 10^{-5}$ | — | — |
| $1 \times 10^{-4}$ | 58.8 | 36.4 |
| $2 \times 10^{-4}$ | 70. | 47.6 |
| $3 \times 10^{-4}$ | 86.8 | 59.0 |

It will be clearly seen from Table 2 that the intensity of the anisotropic magnetic field $H_k$ of the magnetic layer 21 increases as the tensile strain is increased.

It will also be seen from Table 2 that the intensity of the anisotropic magnetic field differs depending on the positive direction or the negative direction in which the external magnetic field is applied. It will additionally be seen by looking into the magnetization curves of FIGS. 5A through 5D that, when the strain ∈ applied to the magnetic layer 21 is not leas than $2 \times 10^{-4}$, the loop of the magnetization curve is asymmetric as in the case of FIGS. 5C and 5D. From these findings, it is clear that the magnetization of the magnetic layer 21 becomes asymmetric depending on the positiveness or the negativeness of the direction in which the external magnetic field is applied. This indicates that an anti-ferromagnetic ingredient exists in the magnetic layer 21 that is made of a ferromagnetic material. In other words, it is known that a phenomenon of magnetic phase transition from a ferromagnetic state to an anti-ferromagnetic state or vice versa occurs in an Fe—Rh alloy and the above finding indicates that the phenomenon of magnetic phase transition appears when strain is applied thereto.

From the results obtained by observing the magnetization of the magnetic thin film layer 21 of an Fe—Rh when tensile strain was applied intra-planarly to the thin film as described above, the following conclusions can be drawn.

Firstly, the change in the magnetic anisotropy that occurs in the magnetic layer 21 made of an Fe—Rh alloy when tensile strain is applied thereto is sufficiently large and can be used to control the direction of magnetization of the magnetic material in a direction parallel to the direction of strain application. It is a well known fact that, when strain is applied to a magnetic material, there appears a phenomenon of controlling the direction of magnetization to a direction parallel or perpendicular to that of strain application, which is referred to magnetic anisotropy. This is magnetic anisotropy attributable to a reverse effect of magnetic strain. In the above experiment, it was proved that the magnetic strain of the Fe—Rh alloy was sufficiently large. Therefore, by selecting a material showing magnetic strain to a large extent or a material whose magnetic anisotropy is highly dependent on the strain applied thereto such as the above described alloy for the strain-sensitive magnetic layer of a magnetic functional element according to the invention, it is possible to realize a magnetic functional element that can reliably control the direction of magnetization.

Secondly, magnetic phase transition occurs between a ferromagnetic state and an anti-ferromagnetic state as the magnetic material is subjected to strain. Therefore, a magnetic functional element that can reliably control the magnetic phase transition can be realized by appropriately selecting a material that is apt to produce magnetic phase transition by means of strain for the strain-sensitive magnetic layer of a magnetic functional element according to to the invention.

Materials that show magnetic anisotropy highly dependent on strain include alloys containing at least one of the elements of Fe, Co, Ni and Mn. Such an alloys are advantages in that they can be processed with ease for the purpose of the invention if compared with oxides. Specific examples of alloy that can suitably be used for the purpose of the present invention include Fe—Co—V, Co—Ni, Fe—Al and Mn—Bi. Alloys containing a rare-earth element and at least one of the elements selected from Fe, Co and Ni can also suitably be used for the purpose of the invention. Such alloys show a particularly large absolute value for magnetic strain among various magnetic materials. Specific examples of alloy of the above identified type include $TbFe_2$, $Tb_{70}Fe_{30}$, $Tb(CoFe)_2$, $Tb(NiFe)_2$, $SmFe$, $ErFe_2$, and $SmFe_3$. Additionally, alloys containing a metal element of the and at least one of the elements selected from Fe, Co and Ni can also suitably be used for the purpose of the invention. Such alloys show an excellent corrosion resistance and a high tenacity. Specific examples of alloy of this type include $Fe_{70}Pd_{30}$ and $Fe_{50}Rh_{50}$. Other materials that can be used for the strain-sensitive magnetic layer of a magnetic functional element according to the invention include Co type ferrite, Ni type ferrite, Ba type ferrite, rare earth-iron garnet and solid solutions containing one of these materials as principle ingredient. While these material are accompanied by a slight difficulty for crystallization, they are highly corrosion resistant.

Materials that are apt to give rise to magnetic phase transition between a ferromagnetic state and an anti-ferromagnetic state by strain include Fe—Rh, Mn—Rh and Cr—S along with Mg-type pevroskite. These materials provide an advantage of not rusting because they are already oxides. Specific examples of this type of material include $La_{1-x}Sr_xMnO_3$, $Cr_{1-x}Ca_xMnO_3$ and $Nd_{1-x}Sr_xMnO_3$. Materials that are apt to give rise to magnetic phase transition between a ferromagnetic state and a paramagnetic state by strain include $FeRh_{1-x}Pt_x$ and $FeRh_{1-x}Ir_x$.

As described above, the strain-sensitive magnetic layer of a magnetic functional element according to the invention is so configured that it has a characteristic feature of changing its magnetic anisotropic and producing a magnetic phase transition strain is applied thereto. Therefore, a solid-state non-volatile memory, a current control element, an analog amplifier, a variable resistance element or a logic circuit can be realized by using a magnetic functional element according to the invention. Similarly, a vide server, a video camera or an electronic communication terminal unit can be realized by using a magnetic functional element according to the invention. Additionally, a magnetic functional element according to the invention may be used to realize any of various recording/reproduction apparatus for recording and/or reproducing information such as audio information and/or video information and card-shaped and chip-shaped removable memory media.

Now, the present invention will be described in greater detail in terms of a case where a magnetic functional element according to the invention is used as solid-state magnetic memory.

Two method may be conceivable for using magnetic functional element according to the invention as solid-state magnetic memory. A first one is that of utilizing the strain dependency of the magnetic anisotropy of the strain-sensitive magnetic layer and a second one is that of utilizing the magnetic phase transition of the strain-sensitive magnetic layer between a ferromagnetic state and an anti-ferromagnetic state or between a ferromagnetic state and a paramagnetic state.

Figure 6:
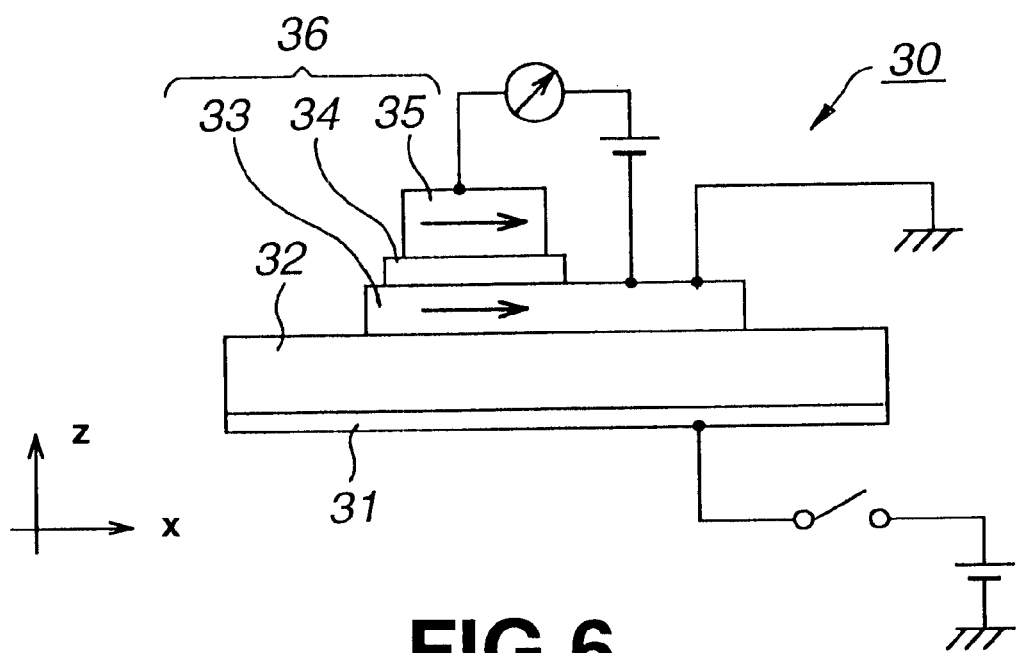
FIG. 6 is a schematic lateral view of still another embodiment of magnetic functional element according to the invention and comprising means for detecting the direction of magnetization.

To begin with, a case of using a magnetic functional element according to the invention as a solid-state magnetic memory by utilizing the strain dependency of its magnetic anisotropy will be discussed by referring to FIG. 6 showing a magnetic functional element 30 adapted to such an application.

As shown in FIG. 6, the magnetic functional element 30 comprises an electrically conductive electrode layer 31, a piezoelectric layer 32 adapted to generate strain as voltage is applied thereto, a strain-sensitive magnetic layer 33 whose direction of magnetization is changed by strain, a non-magnetic layer 34 and a magnetic layer 35 sequentially laid one on the other in the above mentioned order to produce a multilayer structure. The strain-sensitive magnetic layer 33 changes its direction of magnetization by strain and is made of an electrically conductive material so that it operates as electrode of the piezoelectric layer 32. In other words, the magnetic functional element 30 comprises a piezoelectric layer 32 arranged between a pair of electrodes, which are the electrode layer 31 and the strain-sensitive magnetic layer 33.

Like the above described magnetic functional element 10, when no voltage is applied between the pair of electrodes and hence no strain is applied to the strain-sensitive magnetic layer 33, the strain-sensitive magnetic layer 33 of the magnetic functional element 30 is magnetized in the +x-direction. Then, as a voltage is applied to the piezoelectric layer 32 to apply strain to the strain-sensitive magnetic layer 33, the direction of magnetization of the strain-sensitive magnetic layer 33 is shifted from the +x-direction.

As described above, in the magnetic functional element 30, the direction of magnetization of the strain-sensitive magnetic layer 33 is controlled by controlling the strain applied to the strain-sensitive magnetic layer 33 in order to make the magnetic functional element 30 operate as solid-state magnetic memory device adapted to store information by the direction of magnetization. For example, a value of "1" may be stored when the direction of magnetization of the strain-sensitive magnetic layer 33 agrees with the +x-direction, whereas a value of "0" may be stored when the direction of magnetization of the strain-sensitive magnetic layer 33 is shifted from the +x-direction. The magnetic fuctional element 30 operates as solid-state magnetic memory adapted to binary recording.

Meanwhile, the magnetic layer 35 is magnetized in the +x-direction and does not change its direction of magnetization. The non-magnetic layer 34 is a thin film of an electrically conductive non-magnetic material such as Cu. In the magnetic functional element 30, the strain-sensitive magnetic layer 33, the non-magnetic layer 34 and the magnetic layer 35 operate as spin bulb and reproduce the stored information by utilizing the magnetoresistive effect. In the following description, the portion of the magnetic functional element 30 where the strain-sensitive magnetic layer 33, the non-magnetic layer 34 and the magnetic layer 35 are laid will be referred to as MR section 36.

When both the strain-sensitive magnetic layer 33 and the magnetic layer 35 have a same direction of magnetization, the MR section 36 shows a small electric resistance. When, on the other hand, the direction of magnetization of the strain-sensitive magnetic layer 33 is shifted from that of the magnetic layer 35, the MR section 36 shows a large electric resistance. This phenomenon is caused by spin-dependent scattering of electrons that takes place along the interface of the pair of magnetic layers of the strain-sensitive magnetic layer 33 and the magnetic layer 35 and the non-magnetic layer 34.

In the magnetic functional element 30, the direction of magnetization can be detected to reproduce the recorded information by detecting the electric resistance of the MR section 36.

While the MR section 36 is constituted by the strain-sensitive magnetic layer 33, the non-magnetic layer 34 and the magnetic layer 35 so as to detect the direction of magnetization of the strain-sensitive magnetic layer 33 in the above description, means for detecting the direction of magnetization that can be used for the purpose of the invention is not limited thereto. For example, it is not necessary for the magnetic functional element 30 to have an MR section 36 and it may alternatively be so arranged that the electric resistance of the strain-sensitive magnetic layer 33 itself is changed by the magnetoresistive effect. Then, the overall configuration of the element can be simplified. Still alternatively, the direction of magnetization of the strain-sensitive magnetic layer 33 may be detected not by using the magnetoresistive effect but by using the Hall effect.

For the strain-sensitive magnetic layer 33 and the magnetic layer 35 of the above described magnetic functional element 30 to show their respective directions of magnetization that are shifted from each other to store a value of "0", it is necessary to keep applying a voltage to the piezoelectric layer 32. However, a solid-state non-volatile memory that can store information without constantly applying a voltage thereto can be realized by providing the magnetic functional element 30 with a storage magnetic layer that is magnetically coupled with the strain-sensitive magnetic layer 33 and shows a magnetic anisotropy. Now, a magnetic functional element 40 according to the invention and designed to operate as a solid-state non-volatile memory will be described by referring to FIG. 7.

Figure 7:
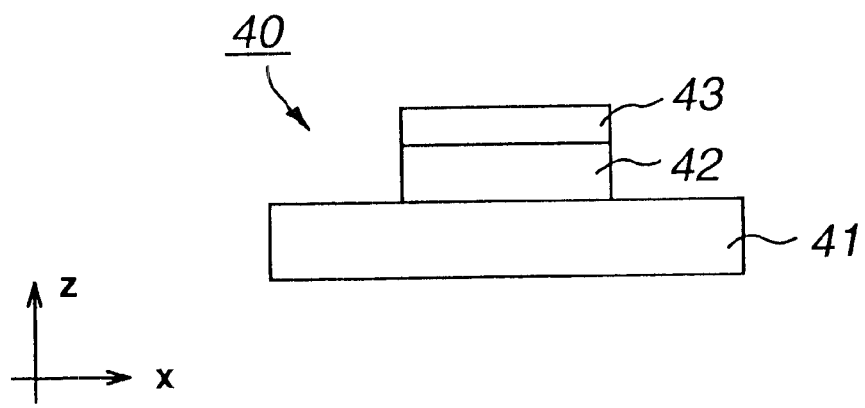
FIG. 7 is a schematic lateral view of still another embodiment of magnetic functional element according to the invention and comprising a storage magnetic layer.

As seen from FIG. 7, the magnetic functional element 40 comprises a strain applying layer 41, a strain-sensitive magnetic layer 42 and a storage magnetic layer 43 magnetically coupled with the strain-sensitive magnetic layer 33 and showing a magnetic anisotropy, the layers being laid one on the other in the above mentioned order to form a multilayer structure. Since the strain generating arrangement of the magnetic functional element 40 may be same as that of the above described magnetic functional element 1, it will be omitted from FIG. 7 and will not be described here any further. Similarly, the electrodes of the strain generating arrangement and the means for detecting the stored information of the magnetic functional element 40 maybe same as those of the above described magnetic functional element 30 and hence they will also be omitted from FIG. 7 and will not be described here either.

Figure 8:
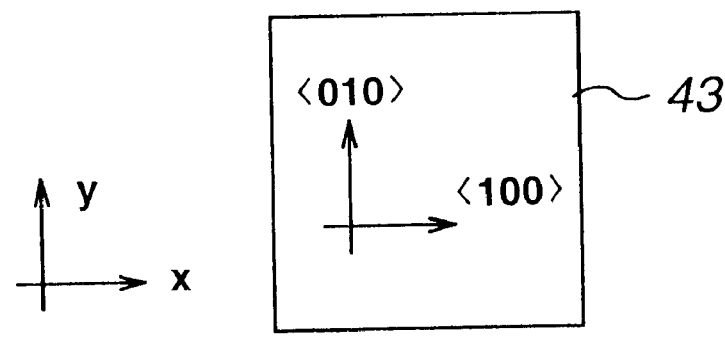
FIG. 8 is an exploded schematic plan view of the embodiment of magnetic functional element of FIG. 7.
Figure 8:
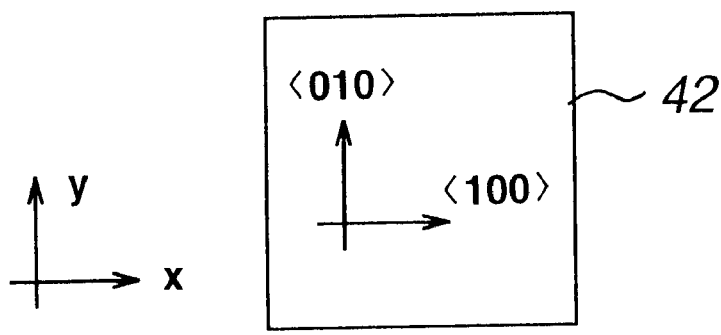
Figure 8:
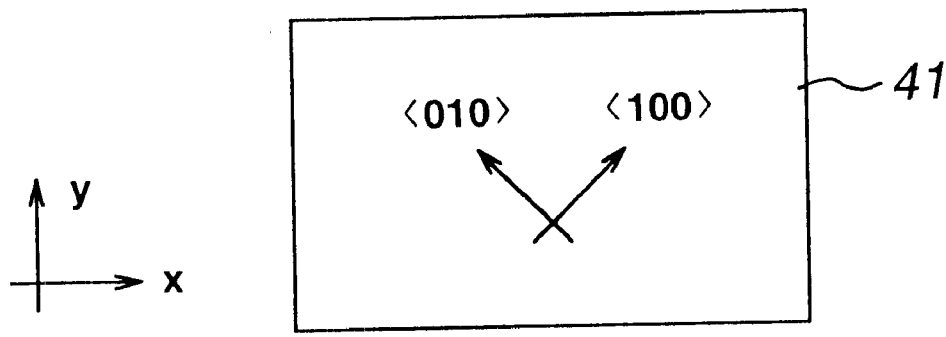

The strain applying layer 41, the strain-sensitive magnetic layer 42 and the storage magnetic layer 43 of the magnetic functional element 40 are respectively made of MgO, an Fe—Rh alloy and an Fe—Ni alloy. Fe-type bcc metals such as an Fe—Rh alloy and an Fe—Ni alloy can be made to epitaxially grow on the (100) plane of the strain applying layer 41 made of MgO. As for the bearing of the crystals, the (100) plane of the Fe—Rh alloy and that of the Fe—Ni alloy tend to become parallel to the (001) plane of MgO while the <100> axis and the <010> axis of the Fe—Rh alloy and the Fe—Ni alloy tend to be turned by 45° within the (001) plane to make them show an angle of 45° relative to the axis of the MgO. FIG. 7 is a schematic lateral view of the magnetic functional element 40 comprising a storage magnetic layer and FIG. 8 is an exploded schematic plan view of the magnetic functional element 40 of FIG. 7.

Both the strain-sensitive magnetic layer 42 and the memory magnetic layer 43 formed by epitaxial growth on the strain applying layer 41 that is made of MgO have a (001) thin film plane and a four-times symmetric crystal structure around the <001> axis that is perpendicular to the thin film plane. Then, the easy direction of magnetization that is defined by magneto-crystalline anisotropy in the thin film plane of the memory magnetic layer 43 also appears in four directions to reflect the clear four-times symmetry. If the constant $K_1$ of magneto-crystalline anisotropy of a material has a positive value as in the case of the Fe—Ni alloy used in the above embodiment, the easy axis of magnetization of the material will by in the direction of intra-planar [100]. Therefore, if the crystal axes are arranged in a manner as shown in FIG. 8, the memory magnetic layer 43 has an easy axis of magnetization along the x-axis and also along the y-axis to show a clear magnetic anisotropy.

If the direction of magnetization of the strain-sensitive magnetic layer 42 of the magnetic functional element 40 initially agrees with the +x-direction, the memory magnetic layer 43 that is ferromagnetically coupled with the strain-sensitive magnetic layer 42 also has a direction of magnetization in the +x-direction. If tensile strain is applied along the direction of the y-axis to the strain-sensitive magnetic layer 42 in this initial state, the strain-sensitive magnetic layer 42 comes to show a remarkable magnetic anisotropy that makes magnetization easy in the direction of the y-axis in FIG. 8. Then, due to this magnetic anisotropy, the magnetization of the strain-sensitive magnetic layer 42 will be affected by the drive effect oriented in the direction of the y-axis in FIG. 8. Thus, because the memory magnetic layer 43 is ferromagnetically coupled; with the strain-sensitive magnetic layer 42, the former is driven in the direction of the y-axis along with the strain-sensitive magnetic layer 42.

Then, as the strain applied to the strain-sensitive magnetic layer 42 is removed, the magnetic anisotropy of the strain-sensitive magnetic layer 42 is reduced to make the magnetic anisotropy of the memory magnetic layer 43 dominant. However, both the direction of magnetization of the strain-sensitive magnetic layer 42 and that of the memory magnetic layer 43 are held in parallel with the direction of the easy axis of magnetization of the memory magnetic layer 43. In other words, they are held to the direction of the y-axis that is the direction of magnetization immediately before the removal of strain, although the memory magnetic layer 43 has an easy axis of magnetization along the x-axis and also one along the y-axis.

If tensile strain is applied along the x-axis or compressive strain is applied along the y-axis to the strain-sensitive magnetic layer 42 under this condition, the direction of magnetization of the strain-sensitive magnetic layer 42 and that of the memory magnetic layer 43 come to agree with the direction of the x-axis in FIG. 8, which may be the +x-direction or the −x-direction. Then, as described above, the direction of magnetization of the strain-sensitive magnetic layer 42 and that of the memory magnetic layer 43 are held to the direction of the x-axis after the strain applied to the strain-sensitive magnetic layer 42 is removed.

Each of the layers of the magnetic functional element 40 is not necessarily be made of any of the materials listed above. However, it is desirably that the memory magnetic layer 43 is made of a material that shows an appropriate degree of magnetic anisotropy and an appropriately low level of saturated magnetization and can easily obtain a single domain structure. If the direction of <100> of <010> is used for the easy axis of magnetization as in the embodiment of FIGS. 7 and 8, it is necessary to select a material showing a positive value for the constant $K_1$ of magnetocrystalline anisotropy.

As described above, due to the fact that the magnetic fuctional element 40 comprises a memory magnetic layer 43 showing a clear magnetic anisotropy, both the direction of magnetization of the strain-sensitive magnetic layer 42 and that of the memory magnetic layer 43 that is magnetically coupled with the strain-sensitive magnetic layer 42 can be stably held in the direction of the x-axis or that of the y-axis. Therefore, like the above described magnetic functional element 30 where it is not necessary to keep on applying a voltage to the piezoelectric layer 32 to retain the direction of magnetization and hence the information stored therein, the magnetic functional element 40 can also be used as solid-state non-volatile memory. Thus, the power consumption rate necessary for its operation can be further reduced.

Figure 9A:
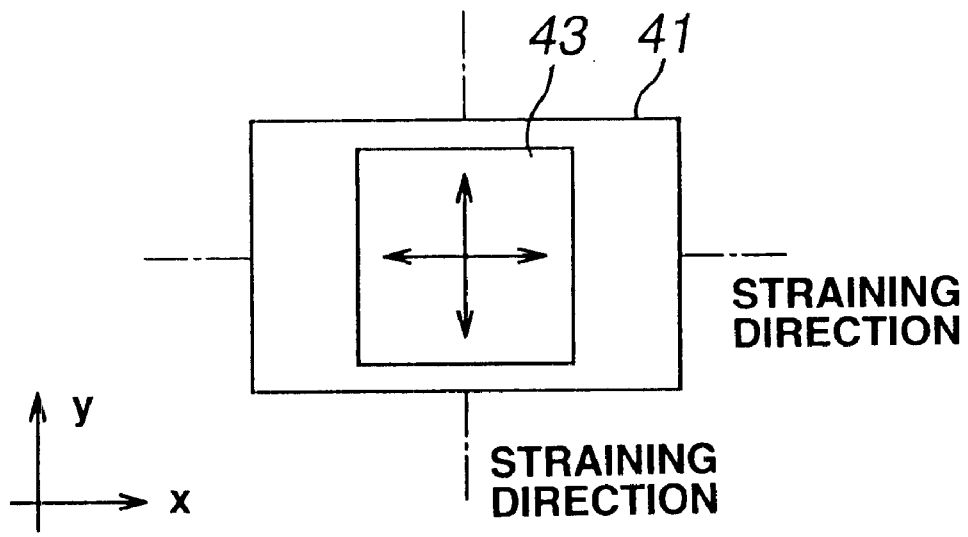

In the above description on the magnetic functional element 40, the easy axis of magnetization of the memory magnetic layer 43 agrees with that of the x-axis or that of the y-axis and the direction along which strain is applied to the strain-sensitive magnetic layer 42 also agrees with that of the x-axis or the y-axis in FIG. 9A. Therefore, if tensile strain is applied to the strain-sensitive magnetic layer 42 along the y-axis when the direction of magnetization of the strain-sensitive magnetic layer 42 and that of the memory magnetic layer 43 agree with the +x direction, it is not possible to say if the direction of magnetization of the strain-sensitive magnetic layer 42 and that of the memory magnetic layer 43 is in the +y direction or in the −y direction. Thus, the magnetic functional element 40 operates as binary solid-state non-volatile memory adapted to store information depending on the direction of magnetization of the strain-sensitive magnetic layer 42 and that of the memory magnetic layer 43 that are held either along the x-axis or along the y-axis.

Figure 9B:
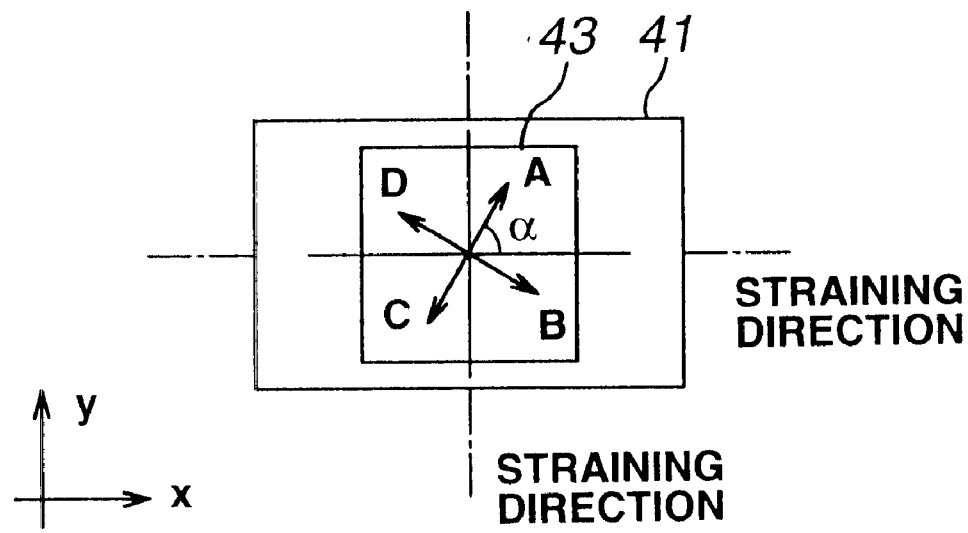
Figure 10:
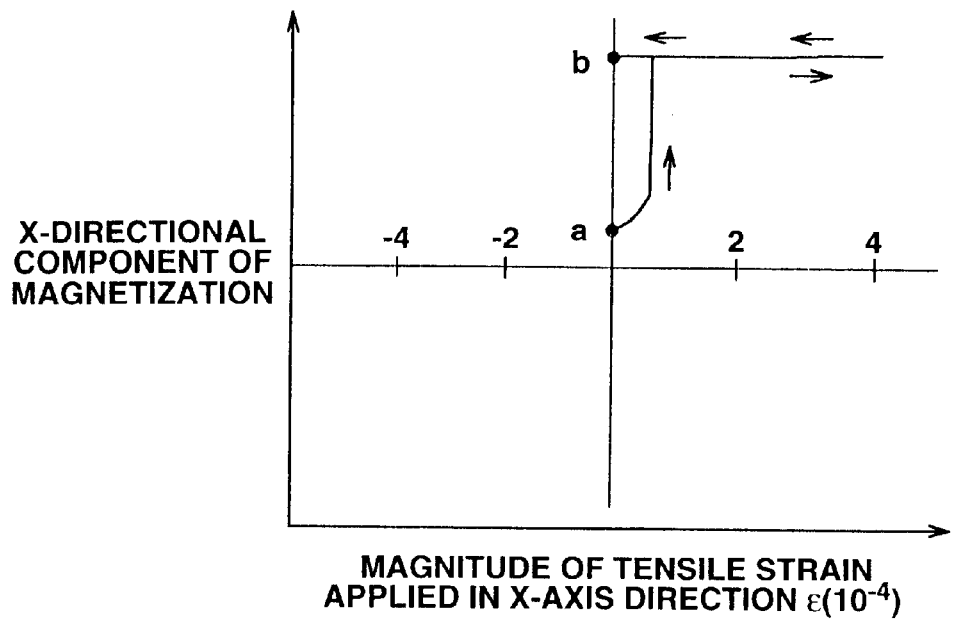
FIG. 10 is a graph illustrating the relationship between the magnitude of strain and the component of magnetization in the direction of strain in an operation of the embodiment of FIG. 7.
Figure 11:
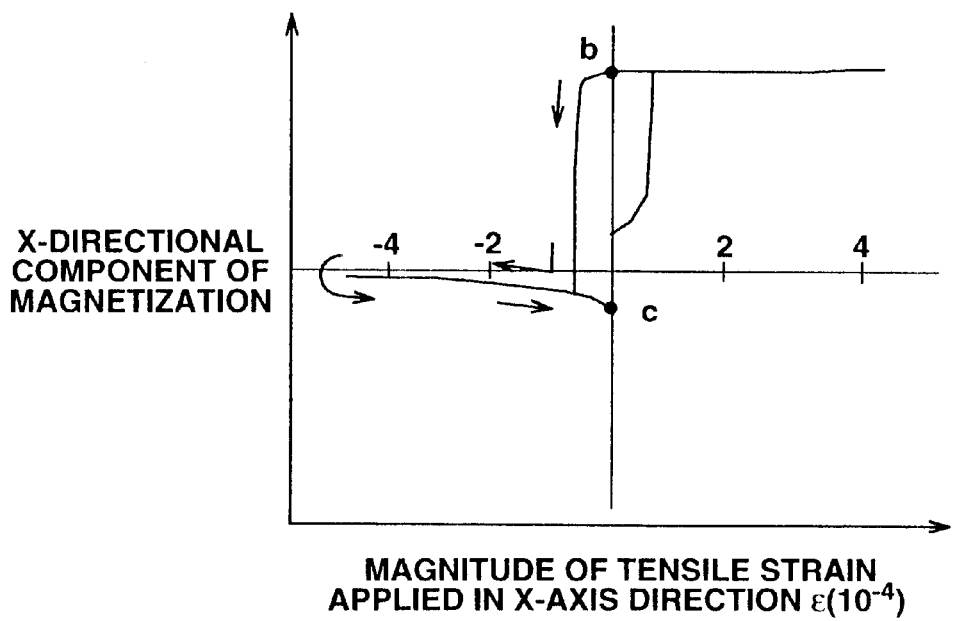
FIG. 11 is a graph also illustrating the relationship between the magnitude of strain and the component of magnetization in the direction of strain in an operation of the embodiment of FIG. 7.
Figure 12:
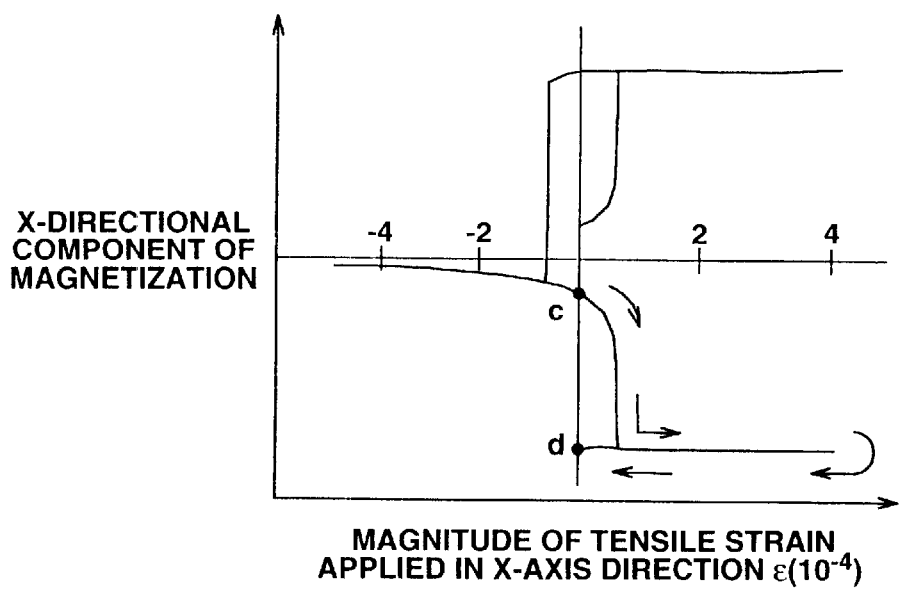
FIG. 12 is a graph illustrating the relationship between the magnitude of strain and the component of magnetization in the direction of strain in an operation of the embodiment of FIG. 7.
Figure 13:
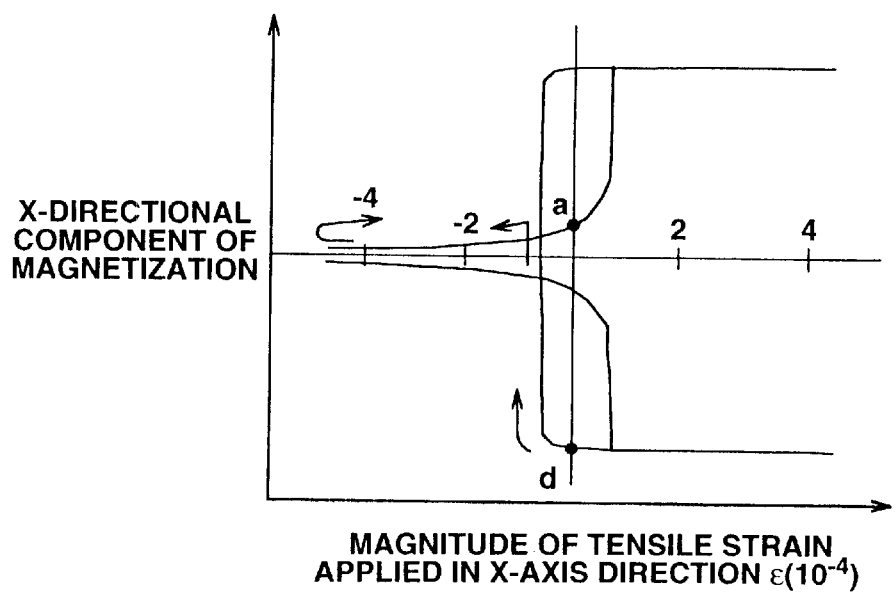
FIG. 13 is a graph illustrating the relationship between the magnitude of strain and the component of magnetization in the direction of strain in an operation of the embodiment of FIG. 7.

However, as shown in FIG. 9B, in the magnetic functional element 40, the direction of magnetization of the strain-sensitive magnetic layer 42 and that of the memory magnetic layer 43 can be held stably in any of three or more than three intra-planar directions of the thin films by arranging the easy axis of magnetization of the memory magnetic layer 43 so as to show an angle α between 0° and 90° relative to the direction along which strain is applied to the strain-sensitive magnetic layer 42. Then, a multi-valued solid-state non-volatile memory can be realized by using such a magnetic functional element 40 to store information depending on the retained direction of magnetization. Such an embodiment will be described below by referring to FIGS. 9B and 10 through 13. In each of FIGS. 10 through 13, the horizontal axis represents the magnitude of tensile strain along the x-axis and the vertical axis represents the x-directional component of magnetization of the strain-sensitive magnetic layer 42 and the memory magnetic layer 43. Negative values on the horizontal axis in any of FIGS. 10 through 13 indicates compressive strain applied along the x-axis.

Referring to FIG. 9B, assume that the easy axis of magnetization of the memory magnetic layer 43 and the direction of strain application of the strain-sensitive magnetic layer 42 shows an angle α of 80° in the magnetic functional element 40 and the direction of magnetization of both the strain-sensitive magnetic layer 42 and the memory magnetic layer 43 is initially directed in the direction of arrow A in FIG. 9A. Under this condition, the x-directional component of magnetization of the strain-sensitive magnetic layer 42 and the memory magnetic layer 43 takes a value as indicated by point a in FIG. 10.

As tensile strain is applied to the strain-sensitive magnetic layer 42 along the x-axis, the direction of magnetization of the strain-sensitive magnetic layer 42 will be shifted to the +x-direction in FIG. 9B. Thereafter, when the strain is removed, both the direction of magnetization of the strain-sensitive magnetic layer 42 and that of the memory magnetic layer 43 are affected by the magnetic anisotropy of the memory magnetic layer 43 and come to be held stably in the direction of arrow B in FIG. 9B. Then, the x-directional component of magnetization of the strain-sensitive magnetic layer 42 and the memory magnetic layer 43 changes in a manner indicated by the arrow in FIG. 10 until it becomes stable at point b in FIG. 10.

Then, as compressive strain is applied to the strain-sensitive magnetic layer 42 along the x-axis, the direction of magnetization of the strain-sensitive magnetic layer 42 will be shifted to the −y-direction in FIG. 9B. Thereafter, when the strain is removed, both the direction of magnetization of the strain-sensitive magnetic layer 42 and that of the memory magnetic layer 43 are affected by the magnetic anisotropy of the memory magnetic layer 43 and come to be held stably in the direction of arrow C in FIG. 9B. Then, the x-directional component of magnetization of the strain-sensitive magnetic layer 42 and the memory magnetic layer 43 changes in a manner indicated by the arrow in FIG. 11 until it becomes stable at point c in FIG. 11.

Thereafter, as tensile strain is applied to the strain-sensitive magnetic layer 42 along the x-axis, the direction of magnetization of the strain-sensitive magnetic layer 42 will be shifted to the −x-direction in FIG. 9B. Thereafter, when the strain is removed, both the direction of magnetization of the strain-sensitive magnetic layer 42 and that of the memory magnetic layer 43 are affected by the magnetic anisotropy of the memory magnetic layer 43 and come to be held stably in the direction of arrow D in FIG. 9B. Then, the x-directional component of magnetization of the strain-sensitive magnetic layer 42 and the memory magnetic layer 43 changes in a manner indicated by the arrow in FIG. 12 until it becomes stable at point d in FIG. 12.

Finally as compressive strain is applied to the strain-sensitive magnetic layer 42 along the x-axis, the direction of magnetization of the strain-sensitive magnetic layer 42 will be shifted to the +y-direction in FIG. 9B. Thereafter, when the strain is removed, both the direction of magnetization of the strain-sensitive magnetic layer 42 and that of the memory magnetic layer 43 are affected by the magnetic anisotropy of the memory magnetic layer 43 and come to be held stably in the direction of arrow A in FIG. 9B. Then, the x-directional component of magnetization of the strain-sensitive magnetic layer 42 and the memory magnetic layer 43 changes in a manner indicated by the arrow in FIG. 13 until it becomes stable once again at point a in FIG. 13.

Thus, by using a magnetic functional element 40 having a configuration as described above, the direction of magnetization of the strain-sensitive magnetic layer 42 and that of the memory magnetic layer 43 can be held stably in any of the four intra-planar directions of the thin films without constantly applying strain tot he strain-sensitive magnetic layer 42 so that a 4-valued solid-state non-volatile memory can be realized by using such a magnetic functional element. With the magnetic functional element 40, it is possible to rotatively control the magnetization of the strain-sensitive magnetic layer 42 to make it show a desired direction by defining the angle α between the easy axis of magnetization of the memory magnetic layer 43 and the direction along which strain is applied to the strain-sensitive magnetic layer 42 to be $0°<α<90°$. Note, however, that the angle is preferably defined to be as $5°<α<40°$ or $50°<α<85°$. With such an arrangement, the direction of magnetization of the strain-sensitive magnetic layer 42 can be reliably rotated to show a desired direction.

A multi-valued memory utilizing intra-planar changes in the direction of magnetization within a thin film as in the case of the magnetic functional element 40 can hardly be realized by any conventional magnetic functional element that is designed to control the direction of magnetization by a magnetic field generated by flowing an electric current through a conductor. To the contrary, with the magnetic functional element 40, a multi-valued memory can be realized without difficulty by intermittently applying strain to the strain-sensitive magnetic layer 42.

While the strain-sensitive magnetic layer 42 and the memory magnetic layer 43 are formed on the strain applying layer 41 by epitaxial growth to make the easy axis of magnetization of the memory magnetic layer 43 controllable in the above description, it should be noted that the present invention is by no means limited thereto.

For example, by using a technique of forming a thin film of an Fe—Ni alloy by sputtering, it is possible to realize a magnetic thin film showing a uniaxial magnetic anisotropy having its axis running in the direction along which a magnetic field is applied thereto. Alternatively, a magnetic functional element may be formed by laying two magnetic thin films showing respective directions of magnetic anisotropy that intersect each other rectangularly by using the above technique. Then, in such a magnetic functional element, the directions of magnetization of the two magnetic thin films that are substantially same relative to each other change as strain is applied to the strain-sensitive magnetic layer. Therefore, in terms of the two magnetic thin films, the direction of magnetization can be held stably in any of the four directions to make it possible to realize a multi-valued solid-state non-volatile memory.

Now, unlike the above described magnetic functional elements 30 and 40, a magnetic functional element 50 illustrated in FIG. 14 utilizes magnetic phase transitions of the strain-sensitive magnetic layer between a ferromagnetic phase and an anti-ferromagnetic phase.

Referring to FIG. 14, the magnetic functional element 50 comprises a strain applying layer 51, a first magnetic layer 5, a strain-sensitive magnetic layer 53, a memory magnetic layer 54 and a second magnetic layer 55 laid sequentially one on the other in the above mentioned order. Since the strain-sensitive magnetic layer of the magnetic functional element 50 is structurally similar to that of the above described magnetic functional element 1, it will not be described here any further. Additionally, since the electrode structure of the strain generating system and the means for detecting recorded information of the magnetic functional element 50 are same as those of the above described magnetic functional element 30, they will not be described here either.

In the magnetic functional element 50, the strain-sensitive magnetic layer 53 is a thin film made of a magnetic material apt to produce magnetic phase transitions between a ferromagnetic state and an anti-ferromagnetic state. The direction of magnetization of first magnetic layer 52 and that of the second magnetic layer 55 are differentiated by 180° and held unchanged. Additionally, the first magnetic layer 52 is so arranged that the intensity of its bias magnetic field relative to the memory magnetic layer 54 applied thereto by way of the strain-sensitive magnetic layer 53 is greater than that of the second magnetic layer 55 in a ferromagnetic state. Then, the magnetic functional element 50 is so arranged that the direction of magnetization of the memory magnetic layer 54 changes depending on the phase of the strain-sensitive magnetic layer 53 as the magnetic functional element 50 is operated in a manner as described below.

Figure 14A:
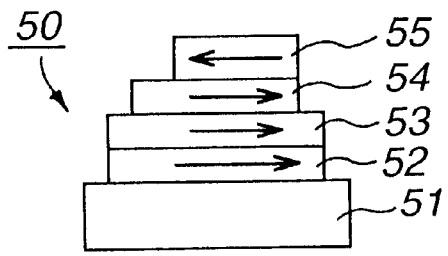

If the strain-sensitive magnetic layer 53 of the magnetic functional element 50 is initially in a ferromagnetic state, the strain-sensitive magnetic layer 53 and the memory magnetic layer 54 are magnetically coupled with the first magnetic layer 52 as shown in FIG. 14A. Under this condition, the direction of magnetization of the strain-sensitive magnetic layer 52 and that of the memory magnetic layer 53 are same as that of the first magnetic layer 52 as indicated by the arrow in FIG. 14A.

Figure 14B:
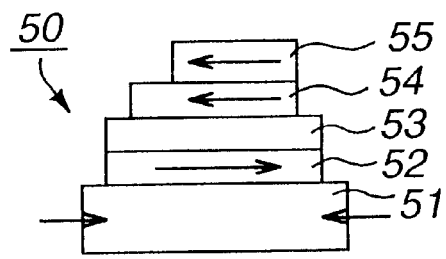

Then, as compressive strain is applied to the strain-sensitive magnetic layer 53, the strain-sensitive magnetic layer 53 changes its magnetic phase from a ferromagnetic state into an anti-ferromagnetic state. In the anti-ferromagnetic state, the undulations along the interface of the thin films on an atomic level disturbs the coherency of the magnetic order so that the long distance coupling will be weakened if compared with its counterpart in the ferromagnetic state. Then, as shown in FIG. 14B, the memory magnetic layer 54 will be influenced more by the bias magnetic field from the second magnetic layer 55 than by the bias magnetic field from the first magnetic layer 52 to become magnetically coupled with the second magnetic layer 55. Thus, under this condition, the direction of magnetization of the memory magnetic layer 54 is same as that of the second magnetic layer 55 indicated by the arrow in FIG. 14B.

Figure 14C:
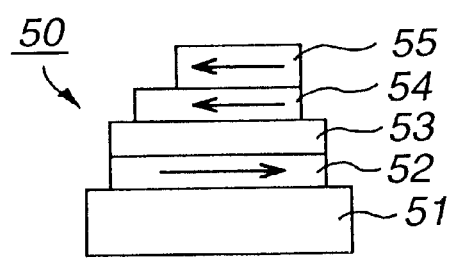
Figure 14D:
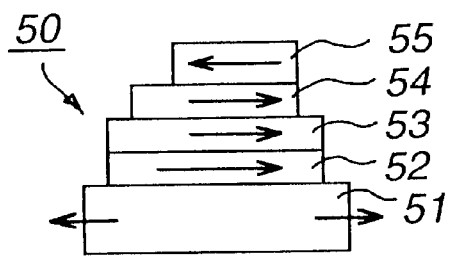

Then, the strain applied to the strain-sensitive magnetic layer 53 is removed as shown in FIG. 14C. As a result, the strain-sensitive magnetic layer 53 is retained in the anti-ferromagnetic state because it has its own history in terms of magnetic phase transition. Thus, the direction of magnetization of the memory magnetic layer 54 is held to be same as that of the second magnetic layer 55.

Then, as tensile strain is applied to the strain-sensitive magnetic layer 53, the strain-sensitive magnetic layer 53 changes its magnetic phase from an anti-ferromagnetic state into a ferromagnetic state. Thus, under this condition, the direction of magnetization of the memory magnetic layer 54 is same as that of the first magnetic layer 52 indicated by the arrow in FIG. 14D. The ferromagnetic state of the strain-sensitive magnetic layer 53 is retained after removing the strain from the strain-sensitive magnetic layer 53 to keep the magnetic functional element 50 in the initial state.

As described above, the direction of magnetization of the memory magnetic layer 54 of the magnetic functional element 50 can be reversibly controlled by controlling the strain applied to the strain-sensitive magnetic layer 53. Additionally, in the magnetic functional element 50, the direction of magnetization of the memory magnetic layer 54 can be retained after removing the strain of the strain-sensitive magnetic layer 53.

Thus, the magnetic functional element 50 can be used as solid-state non-volatile memory that stores information depending on the direction of magnetization of the memory magnetic layer 54. Then, the direction of magnetization of the memory magnetic layer 54 of the magnetic functional element 50 can be detected by utilizing, for example, the magnetic resistance effect as in the case of the MR section 36 of the above described magnetic functional element 30. Alternatively, the direction of magnetization of the memory magnetic layer 54 may be detected by utilizing the Hall effect. If such is the case, the upper surface of the memory magnetic layer 54 may be exposed without being entirely covered by the second magnetic layer 55 and means for detecting the direction of magnetization of the memory magnetic layer 54 may be arranged on the exposed area as shown in FIGS. 14A through 14D.

While the magnetic phase of the strain-sensitive magnetic layer 53 is changed between a ferromagnetic state and an anti-ferromagnetic state depending on the strain applied thereto in the above description, the principle underlying the operation of reverting the direction of magnetization is to make the strength of the ferromagnetic coupling force generated between the first magnetic layer 52 and the memory magnetic layer 54 controllable by arranging a strain-sensitive magnetic layer 53 interposed therebetween. Therefore, the material of the strain-sensitive magnetic layer 53 adapted to control the strength of the ferromagnetic coupling force is not limited to those that show magnetic phase transitions between a ferromagnetic state and an anti-ferromagnetic state and a material that shows magnetic phase transitions between a ferromagnetic state and a paramagnetic state may alternatively be used for the purpose of the invention.

While the direction of magnetization of the memory magnetic layer 54 is affected by those of the first magnetic layer 52 and the second magnetic layer 55 and reversed oppositely, that is by 180°, in the above description. However, since the first magnetic layer 52 and the second magnetic layer 55 are only required to show a uniaxial magnetic anisotropy and to be magnetized in opposite directions, they can be easily formed by applying a magnetic field during the film forming operation typically using a technique of sputtering an Fe—Ni alloy.

For utilizing a change in the magnetic coupling force produced by strain application in the magnetic functional element 50, the memory magnetic layer 54 has to be so arranged as to be exposed to a plurality of processes of bias magnetization in order to realize a multi-valued memory like the above described magnetic functional element 40. While the memory magnetic layer 54 shown in FIGS. 14A through 14D is so arranged as to be influenced by the bias magnetization of the first magnetic layer 52 and that of the second magnetic layer 55 having respective directions of magnetization that are different from each other, the memory magnetic layer 54 may have to be so arranged as to be influenced by four magnetic layers having fixed respective directions of magnetization of, for example, 0°, 90°, 180° and 270° when realizing a four-valued memory.

A first method for realizing such an arrangement is to divide the upper surface and/or the lower surface of the memory magnetic layer 54 into a plurality of regions and couple the regions with respective directions of bias magnetization that are different from each other, although the memory magnetic layer 54 itself has to be made to have properties that do not allow it to be divided into a plurality of magnetic domains.

A second method for realizing such an arrangement is to magnetically couple the two magnetic layers sandwiching the memory magnetic layer 54 with one or two additional magnetic layers that sandwich the first two magnetic layers from outside and show respective directions of magnetization that are different from each other. With this method, a magnetic layer is arranged between the inner magnetic layer(s) and an outer magnetic layer and adapted to control the coupling force. Then, the inner magnetic layers operate with a semi-fixed direction of magnetization.

Thus, with the above arrangement, the direction of magnetization of the memory magnetic layer 54 is determined directly by the inner magnetic layer(s). Then, the inner magnetic layers can show angles of 0° and 180° of 90° and 270° of bias magnetization for the memory magnetic layer 54 by the switching effect of the direction of magnetization of the outer magnetic layer. Thus, a number of magnetic layers may be arranged to show a multilayer structure with different directions of bias magnetization relative to the memory magnetic layer 54 in order to realize a multi-valued memory.

When using either the first method or the second method for laying a number of magnetic layers with different directions of magnetization, the magnetic layers may effectively be formed by epitaxial growth as described above by referring to the magnetic functional element 40.

When controlling the direction of magnetization of the memory magnetic layer 54 by utilizing the magnetic phase transition of the strain-sensitive magnetic layer 53, the intensity of magnetic coupling force binding any of the layers has to be appropriately adjusted. Then, the intensity of magnetic coupling force binding any of the magnetic layers can be controlled by adding a non-magnetic metal element such as Al, a transition metal element such as Ti or V or a tint of a noble metal element such as Au or Cu to the interface of any two adjacently located layers or by oxidizing the interface. Alternatively, the intensity of magnetic coupling force binding any of the magnetic layers can be controlled by causing alcohol or methane that is produced in the vacuum unit for sequentially forming the thin films of the layers to be adsorbed by the surfaces of the layers.

Now, a magnetic recording medium according to the invention will be described. A magnetic recording medium according to the invention comprises a plurality of magnetic functional elements of the invention so that information may be recorded and stored by changing the magnetic state of the strain-sensitive magnetic layer of each of the magnetic functional elements. An embodiment of magnetic recording medium 60 according to the invention will be described below by referring to FIG. 15.

Figure 15:
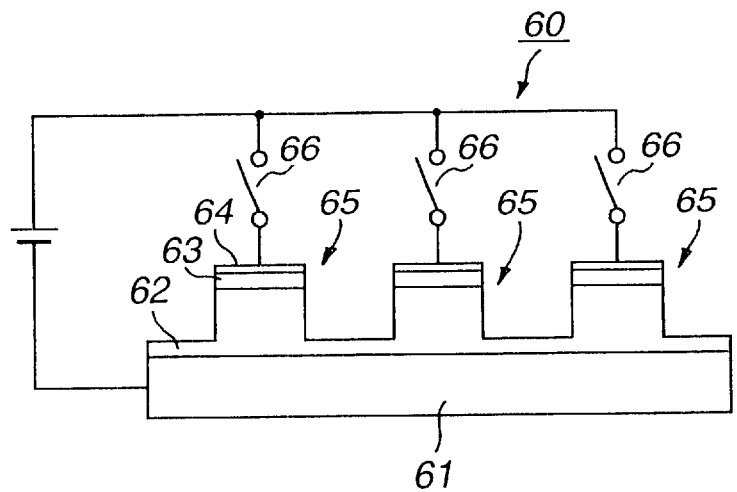
FIG. 15 is a schematic lateral view of an embodiment of magnetic recording medium according to the invention.

As shown in FIG. 15, the magnetic recording medium 60 comprises a first electrode layer 61, a piezoelectric layer 62 adapted to be strained when a voltage is applied thereto, a strain-sensitive magnetic layer 63 and a second electrode layer 64. Thus, in the magnetic recording medium 60, the piezoelectric layer 62 is arranged between the first electrode layer 61 and the second electrode layer 64. The piezoelectric layer 62 operates as strain applying layer for applying strain to the strain-sensitive magnetic layer 63.

In the magnetic recording medium 60, a plurality of separator grooves are arranged to divide the strain-sensitive magnetic layer 63 and the second electrode layer 64 to produce so many magnetic functional elements 66, each operating as the above described magnetic functional element 10, that are separated from each other by the separator grooves 65. Thus, the magnetic recording medium 60 comprises a plurality of magnetic functional elements 66 arranged on the first electrode layer 61.

In the magnetic recording medium 60, the piezoelectric layer 62 located close to the second electrode 64 is strained as a voltage is applied between the first electrode layer 61 and the second electrode layer 64 of a selected magnetic functional element. Then, the strain of the piezoelectric layer 62 is applied to the strain-sensitive magnetic layer 63 of the magnetic functional element that is isolated by the separator grooves at the opposite sides to give rise to a change in the magnetic state of the strain-sensitive magnetic layer 63. Thus, in the magnetic recording medium 60, the magnetic state of the strain-sensitive magnetic layer 63 of any selected magnetic functional element 66 can be controlled.

The separator grooves 65 are preferably so arranged that they divide not only the original strain-sensitive magnetic layer 63 and the original second electrode layer 64 but also the piezoelectric layer 62 to such a depth that the strain of the piezoelectric layer 62 of a magnetic functional element 66 may not affect the piezoelectric layers 62 of the other magnetic functional elements 66. With this arrangement, when the magnetic state of a selected magnetic functional element 66 is controlled, the adjacently located magnetic functional elements 66 may be prevented from being affected by the strain of the first magnetic functional element 66 so that the only the magnetic state of the latter can be controlled reliably.

As described above, in each of the magnetic functional elements 66 of the magnetic recording medium 60, strain is applied to the strain-sensitive magnetic layer 63 by the piezoelectric layer 62 to control the magnetic state of the strain-sensitive magnetic layer 63. Thus, the magnetic recording medium 60 is adapted to reduce its power consumption rate and save energy if compared with conventional solid-state magnetic memories whose magnetic state is controlled by an electric current as in the case of known methods of reversing the direction of magnetization, which may therefore be referred to as current driven type solid-state magnetic memories. Additionally, the rate of heat emission of each of the magnetic functional elements 66 can be reduced n the magnetic recording medium 60 if compared with a current driven type recording medium. Therefore, the magnetic recording medium 60 does not require the use of a specifically arranged cooling system if magnetic functional elements 66 are arranged highly densely therein to realize an enhanced degree of integration and/or the magnetic functional elements 66 are driven at high speed.

Additionally, in the magnetic recording medium 60, the magnetic state of the strain-sensitive magnetic layer 63 of each magnetic functional element 66 can be changed both positively and negatively simply by changing the polarity of the voltage applied to the magnetic functional element 66 unlike known current driven type solid-state magnetic memories. Thus, the magnetic recording medium 60 can be made to show a simple configuration if compared with conventional solid-state magnetic memories.

While the piezoelectric layer 62 is provided with a pair of electrodes, which are the first electrode layer 61 and the second electrode layer 64, in the above description, the strain-sensitive magnetic layer 63 may be used to operate as an electrode layer. Then, the multilayer structure of the magnetic recording medium can be further simplified.

In the magnetic recording medium 60, the first electrode layer 61 of the piezoelectric layer 62 may be made to show a predetermined thickness and a predetermined level of rigidity and operate as a substrate of the entire recording medium. Alternatively, the layers may be formed on a glass or silicon substrate.

Additionally, while a piezoelectric layer 62 is arranged as strain applying layer for applying strain to the strain-sensitive magnetic layer 63 in the above embodiment, a separate strain applying layer may be arranged in addition to the piezoelectric layer as in the case of the above described magnetic functional element 1. Wile strain is applied to the strain-sensitive magnetic layer 63 by the piezoelectric layer 62 in the above described electrode magnetic recording medium 60, it may alternatively be so arranged that strain is produced in the strain applying layer by irradiating an ultrasonic pulse to the strain applying layer, which by turn applies strain to the strain-sensitive magnetic layer 63.

The magnetic state to be controlled in the magnetic recording medium 60 may be the direction of magnetization of the strain-sensitive magnetic layer 63 as in the case of the magnetic functional element 30 and the magnetic functional element 40 or the phase of the strain-sensitive magnetic layer 63 between a ferromagnetic state and an anti-ferromagnetic state or between a ferromagnetic state and a paramagnetic state as in the case of the magnetic functional element 50.

Means for detecting the information recorded in each of the magnetic functional elements of the magnetic recording medium 60 may be that of utilizing the magnetstrictive effect of the Hall effect as in the case of the above described magnetic functional element 30.

Now, another embodiment of magnetic recording medium 70 according to the invention will be described by referring to FIG. 16. This embodiment is realized as extension of the magnetic recording medium 60 in order to make a plurality of magnetic functional elements 66 efficiently store information. The magnetic recording medium 70 has a configuration substantially same as that of the above described magnetic recording medium 60 and the components thereof operates substantially same as their counterparts of the magnetic recording medium 60. Therefore, the components that are same or similar to those of the magnetic recording medium 60 will not be described any further.

The magnetic recording medium 70 comprises a piezoelectric substrate 71 that carries on the two principle surfaces thereon respectively a plurality of first electrodes 72 and a plurality of second electrodes 73 that are arranged perpendicularly relative to the first electrodes 72.

The piezoelectric substrate 71 operates as substrate for supporting the entire device and is made of a piezoelectric material or an electrostrictive material so that it gives rise to strain when a voltage is applied thereto. The piezoelectric substrate 71 is provided with a plurality of separator grooves 74 having a predetermined depth and running substantially in parallel with the second electrodes 73.

Each of the separator grooves 74 of the piezoelectric substrate 71 is provided on the lateral walls thereof with a strain-sensitive magnetic layer 75 at positions where the first electrode 72 and the second electrodes 73 intersect each other. With this arrangement, magnetic functional elements like those of the above described magnetic recording medium 60 are formed at the intersections of the first electrodes 72 and the second electrodes 73.

Since the magnetic functional elements are arranged at the intersections of the first electrodes 72 and the second electrodes 73 to form a matrix in the magnetic recording medium 70, the arrangement of the plurality of magnetic functional elements is neat and orderly so that consequently the magnetic recording medium shows a simplified configuration. Additionally, the magnetic state of each of the magnetic functional elements can be controlled in a simple manner.

The information stored in each of the magnetic functional elements of the magnetic recording medium 70 can be detected without difficulty by a detection means like the MR section 36 of the above described magnetic functional element 30 that is provided in each of the magnetic functional elements. Additionally, the magnetic recording medium 70 can be made to operate as multi-valued memory device by arranging a magnetic layer functioning like the memory magnetic layer 43 of the above described magnetic functional element 40 on the strain-sensitive magnetic layer 75.

When each of the magnetic functional elements of the magnetic recording medium 70 is made of a thin film as in the case of the above described magnetic functional element 50, information will be recorded depending on the direction of magnetization of the memory magnetic layer by utilizing a magnetic phase transition caused by strain in the strain-sensitive magnetic layer 75.

When controlling the magnetic state of a selected one of the plurality of magnetic functional elements of the magnetic recording medium 70, a voltage is applied to a selected pair of one of the plurality of first electrodes 72 and one of the plurality of second electrodes 73. More specifically, a voltage of +E (V) is applied to the first electrode 72, while a voltage of −E (V) is applied to the second electrode 73.

Then, a voltage of 2E (V) is applied to the magnetic fuctional element located at the crossing of the first electrode 72 and the second electrode 73, while a voltage of E (V) or 0 (V) is applied to all the remaining magnetic functional elements. Thus, the strain-sensitive magnetic layer 75 of selected magnetic functional element changes its magnetic state by the strain produced in the piezoelectric layer 71 as the voltage of 2E (V) is applied thereto, whereas the voltage of E(V) is not sufficient to produce strain that is large enough to change the magnetic state of any of the remaining strain-sensitive magnetic layers so that consequently, only the magnetic functional element located at the crossing of the two electrode to which the respective voltages are applied is selectively controlled for recording or reproducing information.

Thus, in the magnetic recording medium 70, only the magnetic state of selected one of the plurality of magnetic functional elements can be controlled without difficulty by applying a voltage to the first electrode 72 and the second electrode 73 that correspond to the selected magnetic functional element.

Figure 16:
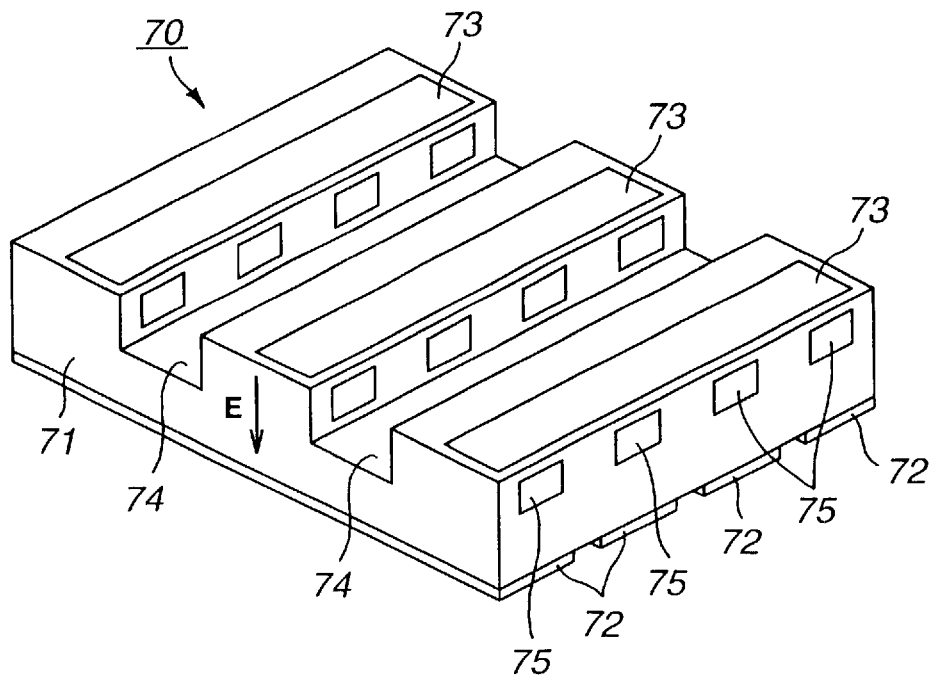
FIG. 16 is a schematic perspective view of another embodiment of magnetic recording medium according to the invention.

The arrow E in FIG. 16 indicates the direction of the electric field and that of the strain generated in the piezoelectric substrate 71 when a voltage is applied to the first electrode and the second electrode 73 selected for specific one of the magnetic functional elements. In other words, the direction of the strain produced in the piezoelectric substrate 71 of the magnetic recording medium 70 and the intra-planar direction of the strain-sensitive magnetic layer 75 formed on the lateral walls of the separator grooves 74 are in parallel with each other so that the magnetic recording medium 70 can further reduce the rate of power consumption required for its operation.

However, it should be noted that the thin film of the strain-sensitive magnetic layer 75 may not be formed precisely to show a high quality level because it is formed on the lateral walls of the separator grooves 74. This problem may be dissolved by tilting the lateral walls of the separator grooves 74 by a predetermined angle. Alternatively, the second electrodes 73 and the strain-sensitive magnetic layers 75 may be arranged in a manner as illustrated in FIG. 17, which shows an arrangement different from that of FIG. 16.

Then, the plurality of first electrodes 72 and the plurality of strain-sensitive magnetic layers 75 are arranged respectively on the opposite principle surfaces of the piezoelectric substrate 71 and the second electrodes 73 are arranged on the lateral walls of the separator grooves 74. Then, the arrow F in FIG. 17 indicates the direction of the electric field and that of the strain generated in the piezoelectric substrate 71 when a voltage is applied to the first electrode and the second electrode 73 selected for specific one of the magnetic functional elements. In other words, the direction of the strain produced in the piezoelectric substrate 71 of the magnetic recording medium 70 and the intra-planar direction of the strain-sensitive magnetic layer 75 formed on the lateral walls of the separator grooves 74 are not in parallel with each other so that the efficiency of applying strain to the strain-sensitive magnetic layer 75 can be reduced, if slightly.

Figure 17:
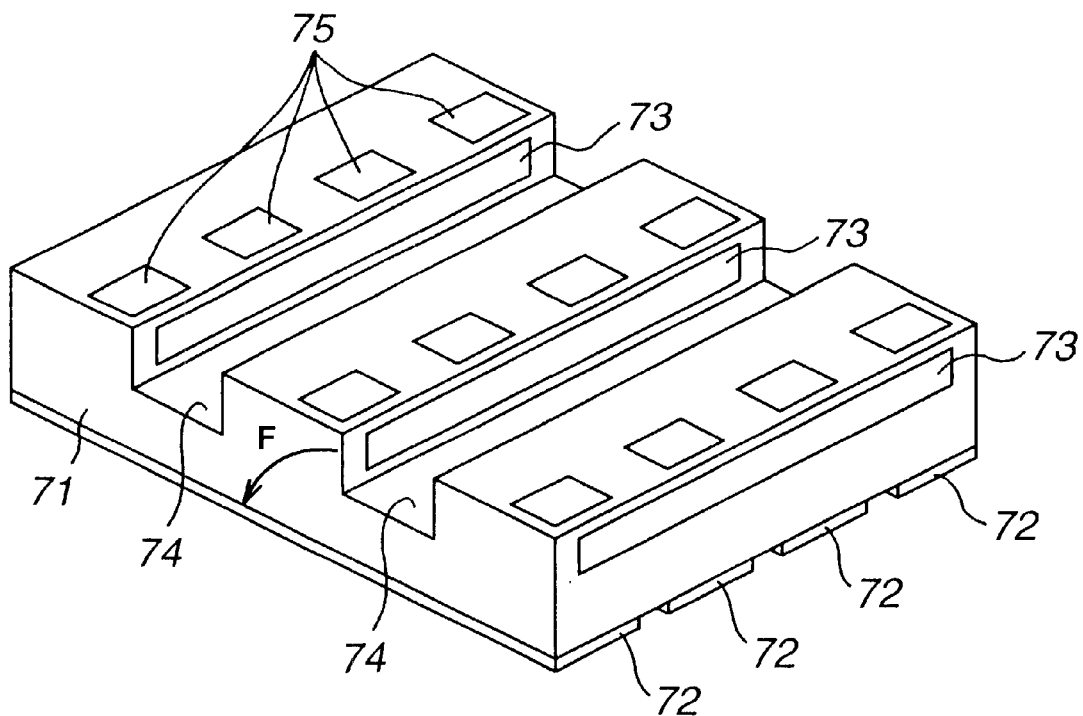
FIG. 17 is a schematic perspective view of still another embodiment of magnetic recording medium according to the invention.

However, the arrangement of FIG. 17 where the strain-sensitive magnetic layers 75 are disposed on one of the principal surfaces of the piezoelectric substrate 71 makes it easily possible to form a thin film precisely to achieve a high quality level for the strain-sensitive magnetic layers 75. Additionally, various thin films may be laid on the strain-sensitive magnetic layers 75 without difficulty as in the case of the magnetic functional element 30 and the magnetic functional element 50 described earlier. Then, means for detecting the direction of magnetization like the MR section 36 of the above described magnetic functional element 30 and/or a thin film operating like the memory magnetic layer 43 of the above described magnetic functional element 40 can be formed easily on the strain-sensitive magnetic layers 75 of the magnetic recording medium 70.

What is claimed is:

1. A magnetic functional element comprising a strain-sensitive magnetic layer having a magnetic state variable with strain and a strain applying layer for applying strain to the strain-sensitive magnetic layer;
    wherein said strain applying layer is made of a material having a piezoelectric effect or an electrostrictive effect and applies the strain produced therein by the voltage applied thereto to said strain-sensitive magnetic layer; and
    wherein information is recorded as a result of a change in the magnetic state of said strain-sensitive magnetic layer.

2. A magnetic functional element according to claim 1, wherein
    said strain-sensitive magnetic layer shows a magnetic phase transition between a ferromagnetic phase and an anti-ferromagnetic phase or between a ferromagnetic phase and a paramagnetic phase as strain is applied thereto.

3. A magnetic functional element according to claim 2, wherein
    said strain-sensitive magnetic layer is made of an Fe—Rh type alloy, an Mn—Rh type alloy or a Cr—S type alloy.

4. A magnetic functional element according to claim 2, wherein
    said strain-sensitive magnetic layer is made of Mn type perovskite.

5. A magnetic functional element according to claim 4, wherein
    said strain-sensitive magnetic layer is made of $La_{1-x}Sr_xMnO_3$, $Cr_{1-x}Ca_xMnO_3$ or $Nd_{1-x}Sr_xMnO_3$.

6. A magnetic functional element according to claim 2, wherein
    said strain-sensitive magnetic layer is made of $FeRh_{1-x}Pt_x$ or $FeRh_{1-x}Ir_x$.

7. A magnetic functional element according to claim 2, wherein
    said strain-sensitive magnetic layer and said memory magnetic layer showing magnetic anisotropy are arranged between first and second magnetic layers showing respective bias magnetic field intensities and respective directions of magnetization different from each other relative to said memory magnetic layer; and
    the direction of magnetization of said memory magnetic layer changes depending on the phase of said strain-sensitive magnetic layer.

8. A magnetic functional element according to claim 7, wherein
    information is recorded depending on the direction of magnetization of said memory magnetic layer.

9. A magnetic functional element according to claim 8, further comprising:
    detection means for detecting the direction of magnetization of said strain-sensitive magnetic layer and reproducing the information therein.

10. A magnetic functional element according to claim 9, wherein
    said detection means detects the direction of magnetization of said strain-sensitive magnetic layer by utilizing the magnetostrictive effect or the Hall effect.

11. A magnetic recording medium comprising:
    a plurality of magnetic functional elements, each including a strain-sensitive magnetic layer having a magnetic state variable with strain and a strain applying layer for applying strain to the strain-sensitive magnetic layer, the elements for recording information by using changes in the strain-sensitive magnetic layer of each element;
    wherein said strain applying layer is made of a material having a piezoelectric effect or an electrostrictive effect and applies the strain produced therein by the voltage applied thereto to said strain-sensitive magnetic layer.

12. A magnetic recording medium according to claim 11, further comprising:
    a plurality of first electrodes running in parallel and a plurality of second electrodes substantially rectangularly intersecting said first electrodes as electrodes for driving said strain applying layer of each of said magnetic functional elements;
    said magnetic functional elements being arranged respectively at the intersections of said first and second electrodes.

13. A magnetic recording medium according to claim 12, wherein
    information is recorded in one of said magnetic functional elements by applying a selected pair of one of said plurality of first electrodes and one of said plurality of second electrodes.

14. A magnetic functional element comprising:
    a strain-sensitive magnetic layer having a magnetic state variable with strain and a strain applying layer for applying strain to the strain-sensitive magnetic layer; and
    ultrasonic pulse generating means for generating an ultrasonic pulse;
    said strain applying layer applying the strain produced therein by the ultrasonic pulse applied thereto to said strain-sensitive magnetic layer; and
    wherein information is recorded as a result of a change in the magnetic state of said strain-sensitive magnetic layer.

15. A magnetic functional element according to claim 14, wherein said strain-sensitive magnetic layer shows a magnetic phase transition between a ferromagnetic phase and an anti-ferromagnetic phase or between a ferromagnetic phase and a paramagnetic phase as strain is applied thereto.

16. A magnetic functional element according to claim 15, wherein
said strain-sensitive magnetic layer is made of an Fe—Rh type alloy, an Mn—Rh type alloy or a Cr—S type alloy.

17. A magnetic functional element according to claim 15, wherein said strain-sensitive magnetic layer is made of Mn type perovskite.

18. A magnetic functional element according to claim 17, wherein
said strain-sensitive magnetic layer is made of $La_{1-x}Sr_xMnO_3$, $Cr_{1-x}Ca_xMnO_3$ or $Nd_{1-x}Sr_xMnO_3$.

19. A magnetic functional element according to claim 15, wherein
said strain-sensitive magnetic layer is made of $FeRh_{1-x}Pt_x$ or $FeRh_{1-x}Ir_x$.

20. A magnetic functional element according to claim 15, wherein
said strain-sensitive magnetic layer and said memory magnetic layer showing magnetic anisotropy are arranged between first and second magnetic layers showing respective bias magnetic field intensities and respective directions of magnetization different from each other relative to said memory magnetic layer; and
the direction of magnetization of said memory magnetic layer changes depending on the phase of said strain-sensitive magnetic layer.

21. A magnetic functional element according to claim 20, wherein
information is recorded depending on the direction of magnetization of said memory magnetic layer.

22. A magnetic functional element according to claim 21, further comprising:
detection means for detecting the direction of magnetization of said strain sensitive magnetic layer and reproducing the information therein.

23. A magnetic functional element according to claim 22, wherein
said detection means detects the direction of magnetization of said strain-sensitive magnetic layer by utilizing the magnetostrictive effect or the Hall effect.

24. A magnetic functional element comprising:
a strain-sensitive magnetic layer having a magnetic state variable with strain and a strain applying layer for applying strain to the strain-sensitive magnetic layer;
wherein said strain applying layer is made of a material having a piezoelectric effect or an electrostrictive effect and applies the strain produced therein by the voltage applied thereto to said strain-sensitive magnetic layer; and
wherein said strain-sensitive magnetic layer changes its direction of magnetization as strain is applied thereto.

25. A magnetic functional element according to claim 24, wherein
said strain-sensitive magnetic layer is made of an alloy containing at least one of Fe, Co, Ni and Mn.

26. A magnetic functional element according to claim 25, wherein
said strain-sensitive magnetic layer is made of Fe—Co—V, Co—Ni, Fe—Al or Mn—Bi.

27. A magnetic functional element according to claim 25, wherein
said strain-sensitive magnetic layer is made of an alloy containing a rare earth element and at least an element selected from Fe, Co and Ni.

28. A magnetic functional element according to claim 27, wherein
said strain-sensitive magnetic layer is made of $TbFe_2$, $Tb_{70}Fe_{30}$, $Tb(CoFe)_2$, $Tb(NiFe)_2$, SmFe, $ErFe_2$, or $SmFe_3$.

29. A magnetic functional element according to claim 25, wherein
said strain-sensitive magnetic layer is made of an alloy containing a platinum group metal element and at least an an element selected from Fe, Co and Ni.

30. A magnetic functional element according to claim 29, wherein
said strain-sensitive magnetic layer is made of $Fe_{70}Pd_{30}$ or $Fe_{50}Rh_{50}$.

31. A magnetic functional element according to claim 24, wherein
said strain-sensitive magnetic layer is made of Co type ferrite, Ni type ferrite, Ba type ferrite, rare earth-iron garnet or solid solution containing any of these as principal ingredient.

32. A magnetic functional element according to claim 24, wherein
information is recorded depending on the direction of magnetization of said strain-sensitive magnetic layer.

33. A magnetic functional element according to claim 32, further comprising:
a memory magnetic layer adapted to be magnetically coupled with said strain-sensitive magnetic layer to show magnetic anisotropy;
said direction of magnetization of said strain-sensitive magnetic layer being stably held at least in either of two directions by said memory magnetic layer.

34. A magnetic functional element according to claim 33, wherein
the direction of strain application to said strain-sensitive magnetic layer and the direction of the easy axis of magnetization of said memory magnetic layer show an angle of $\alpha$ defined by $0°<\alpha<90°$.

35. A magnetic functional element according to claim 34, wherein
the direction of strain application to said strain-sensitive magnetic layer and the direction of the easy axis of magnetization of said memory magnetic layer show an angle of $\alpha$ defined by $5°<\alpha<40°$ or by $50°<\alpha<85°$.

36. A magnetic functional element according to claims 32, further comprising:
detection means for detecting the direction of magnetization of said strain-sensitive magnetic layer and reproducing the information therein.

37. A magnetic functional element according to claim 34, wherein
said detection means detects the direction of magnetization of said strain-sensitive magnetic layer by utilizing the magnetostrictive effect or the Hall effect.

38. A magnetic functional element according to claim 24, wherein said strain-sensitive magnetic layer shows a magnetic phase transition between a ferromagnetic phase and an anti-ferromagnetic phase or between a ferromagnetic phase and a paramagnetic phase as strain is applied thereto.

39. A magnetic functional element according to claim 38, wherein
said strain-sensitive magnetic layer is made of an Fe—Rh type alloy, an Mn—Rh type alloy or a Cr—S type alloy.

40. A magnetic functional element according to claim 38, wherein said strain-sensitive magnetic layer is made of Mn type perovskite.

41. A magnetic functional element according to claim 40, wherein
said strain-sensitive magnetic layer is made of $La_{1-x}Sr_xMnO_3$, $Cr_{1-x}Ca_xMnO_3$ or $Nd_{1-x}Sr_xMnO_3$.

42. A magnetic functional element according to claim 38, wherein
said strain-sensitive magnetic layer is made of $FeRh_{1-x}Pt_x$ or $FeRh_{1-x}Ir_x$.

43. A magnetic functional element according to claim 38, wherein
said strain-sensitive magnetic layer and said memory magnetic layer showing magnetic anisotropy are arranged between first and second magnetic layers showing respective bias magnetic field intensities and respective directions of magnetization different from each other relative to said memory magnetic layer; and
the direction of magnetization of said memory magnetic layer changes depending on the phase of said strain-sensitive magnetic layer.

44. A magnetic functional element according to claim 43, wherein
information is recorded depending on the direction of magnetization of said memory magnetic layer.

45. A magnetic functional element according to claim 44, further comprising:
detection means for detecting the direction of magnetization of said strain sensitive magnetic layer and reproducing the information therein.

46. A magnetic functional element according to claim 45, wherein
said detection means detects the direction of magnetization of said strain-sensitive magnetic layer by utilizing the magnetostrictive effect or the Hall effect.

47. A magnetic functional element comprising:
a strain-sensitive magnetic layer having a magnetic state variable with strain and a strain applying layer for applying strain to the strain-sensitive magnetic layer; and
ultrasonic pulse generating means for generating an ultrasonic pulse;
said strain applying layer applying the strain produced therein by the ultrasonic pulse applied thereto to said strain-sensitive magnetic layer; and
wherein said strain-sensitive magnetic layer changes its direction of magnetization as strain is applied thereto.

48. A magnetic functional element according to claim 47, wherein
said strain-sensitive magnetic layer is made of an alloy containing at least one of Fe, Co, Ni and Mn.

49. A magnetic functional element according to claim 48, wherein
said strain-sensitive magnetic layer is made of Fe—Co—V, Co—Ni, Fe—Al or Mn—Bi.

50. A magnetic functional element according to claim 48, wherein
said strain-sensitive magnetic layer is made of an alloy containing a rare earth element and at least an element selected from Fe, Co and Ni.

51. A magnetic functional element according to claim 50, wherein
said strain-sensitive magnetic layer is made of $TbFe_2$, $Tb_{70}Fe_{30}$, $Tb(CoFe)_2$, $Tb(NiFe)_2$, SmFe, $ErFe_2$, or $SmFe_3$.

52. A magnetic functional element according to claim 48, wherein
said strain-sensitive magnetic layer is made of an alloy containing a platinum group metal and at least an element selected from Fe, Co and Ni.

53. A magnetic functional element according to claim 52, wherein
said strain-sensitive magnetic layer is made of $Fe_{70}Pd_{30}$ or $Fe_{50}Rh_{50}$.

54. A magnetic functional element according to claim 47, wherein
said strain-sensitive magnetic layer is made of Co type ferrite, Ni type ferrite, Ba type ferrite, rare earth-iron garnet or solid solution containing any of these as principal ingredient.

55. A magnetic functional element according to claim 47, wherein
information is recorded depending on the direction of magnetization of said strain-sensitive magnetic layer.

56. A magnetic functional element according to claim 55, further comprising:
a memory magnetic layer adapted to be magnetically coupled with said strain-sensitive magnetic layer to show magnetic anisotropy;
said direction of magnetization of said strain-sensitive magnetic layer being stably held at least in either of two directions by said memory magnetic layer.

57. A magnetic functional element according to claim 56, wherein
the direction of strain application to said strain-sensitive magnetic layer and the direction of the easy axis of magnetization of said memory magnetic layer show an angle of $\alpha$ defined by $0°<\alpha<90°$.

58. A magnetic functional element according to claim 57, wherein
the direction of strain-application to said strain-sensitive magnetic layer and the direction of the easy axis of magnetization of said memory magnetic layer show an angle $\alpha$ defined by $5°<\alpha<40°$ or by $50°<\alpha<85°$.

59. A magnetic functional element according to claim 55, further comprising:
detection means for detecting the direction of magnetization of said strain-sensitive magnetic layer and reproducing the information therein.

60. A magnetic functional element according to claim 57, wherein
said detection means detects the direction of magnetization of said strain-sensitive magnetic layer by utilizing the magnetostrictive effect or the Hall effect.

61. A magnetic functional element according to claim 47, wherein said strain-sensitive magnetic layer shows a magnetic phase transition between a ferromagnetic phase and an anti-ferromagnetic phase or between a ferromagnetic phase and a paramagnetic phase as strain is applied thereto.

62. A magnetic functional element according to claim 61, wherein
said strain-sensitive magnetic layer is made of an Fe—Rh type alloy, an Mn—Rh type alloy or a Cr—S type alloy.

63. A magnetic functional element according to claim 61, wherein said strain-sensitive magnetic layer is made of Mn type perovskite.

64. A magnetic functional element according to claim 63, wherein
said strain-sensitive magnetic layer is made of $La_{1-x}Sr_xMnO_3$, $Cr_{1-x}Ca_xMnO_3$ or $Nd_{1-x}Sr_xMnO_3$.

65. A magnetic functional element according to claim 61, wherein
said strain-sensitive magnetic layer is made of $FeRh_{1-x}Pt_x$ or $FeRh_{1-x}Ir_x$.

66. A magnetic functional element according to claim 61, wherein
said strain-sensitive magnetic layer and said memory magnetic layer showing magnetic anisotropy are arranged between first and second magnetic layers showing respective bias magnetic field intensities and respective directions of magnetization different from each other relative to said memory magnetic layer; and
the direction of magnetization of said memory magnetic layer changes depending on the phase of said strain-sensitive magnetic layer.

67. A magnetic functional element according to claim 66, wherein
information is recorded depending on the direction of magnetization of said memory magnetic layer.

68. A magnetic functional element according to claim 67, further comprising:
detection means for detecting the direction of magnetization of said strain sensitive magnetic layer and reproducing the information therein.

69. A magnetic functional element according to claim 68, wherein
said detection means detects the direction of magnetization of said strain-sensitive magnetic layer by utilizing the magnetostrictive effect or the Hall effect.

70. A magnetic recording medium comprising:
a plurality of magnetic functional elements, each including a strain-sensitive magnetic layer having a magnetic state variable with strain and a strain applying layer for applying strain to the strain-sensitive magnetic layer, the elements for recording information by using changes in the strain-sensitive magnetic layer of each element; and
ultrasonic pulse generating means for generating an ultrasonic pulse;
said strain applying layer applying the strain produced therein by the ultrasonic pulse applied thereto to said strain-sensitive magnetic layer.

* * * * *